US012593510B2

(12) United States Patent
Zhai

(10) Patent No.: US 12,593,510 B2
(45) Date of Patent: Mar. 31, 2026

(54) DISPLAY PANEL AND DISPLAY DEVICE

(71) Applicant: Shanghai Tianma Micro-Electronics Co., Ltd., Shanghai (CN)

(72) Inventor: Yingteng Zhai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/778,166

(22) Filed: Jul. 19, 2024

(65) Prior Publication Data

US 2024/0371892 A1 Nov. 7, 2024

Related U.S. Application Data

(63) Continuation of application No. 18/189,316, filed on Mar. 24, 2023, now Pat. No. 12,068,332.

(30) Foreign Application Priority Data

Nov. 28, 2022 (CN) .......................... 202211504902.X

(51) Int. Cl.
| | |
|---|---|
| *G09G 3/32* | (2016.01) |
| *H01L 25/16* | (2023.01) |
| *H01L 27/12* | (2006.01) |
| *H10D 86/40* | (2025.01) |
| *H10D 86/60* | (2025.01) |

(52) U.S. Cl.
CPC ............... *H10D 86/60* (2025.01); *G09G 3/32* (2013.01); *H01L 25/167* (2013.01); *H10D 86/451* (2025.01)

(58) Field of Classification Search
CPC .................................................... H10K 59/122
See application file for complete search history.

(56) References Cited

U.S. PATENT DOCUMENTS

| | | | | |
|---|---|---|---|---|
| 2001/0038098 A1* | 11/2001 | Yamazaki | ............ | G09G 3/3266 |
| | | | | 257/72 |
| 2005/0263775 A1* | 12/2005 | Ikeda | ................... | H10K 59/122 |
| | | | | 257/79 |
| 2007/0002260 A1* | 1/2007 | Choi | ................... | G02F 1/13394 |
| | | | | 349/155 |
| 2010/0156860 A1* | 6/2010 | Yamamoto | ........... | H10D 86/481 |
| | | | | 345/205 |
| 2018/0120658 A1* | 5/2018 | Kanaya | ............ | G02F 1/136227 |
| 2020/0341332 A1* | 10/2020 | Sugiyama | ......... | G02F 1/136209 |
| 2022/0173174 A1* | 6/2022 | Hatsumi | ................. | G09G 3/30 |

* cited by examiner

*Primary Examiner* — Nan-Ying Yang
(74) *Attorney, Agent, or Firm* — CHRISTENSEN O'CONNOR JOHNSON KINDNESS PLLC

(57) ABSTRACT

Provided are a display panel and a display device. In an embodiment, the display panel includes: a substrate; pixel circuit islands provided at a side of the substrate, one of the pixel circuit islands includes at least one pixel circuit; light-emitting elements provided at a side of the pixel circuit islands away from the substrate and respectively electrically connected to the pixel circuits of the pixel circuit islands; and light-blocking structures including at least one of a reflective structure or a light-absorbing structure. In an embodiment, the light-blocking structures include first light-blocking structures, each of which is provided on at least one sidewall of one pixel circuit island of the pixel circuit islands. In an embodiment, the first light-blocking structure prevents light out of the pixel circuit island from entering the pixel circuit island through the sidewall of the pixel circuit island.

19 Claims, 23 Drawing Sheets

001

R1

01    40    04/41    03    02

001

001

DISPLAY PANEL AND DISPLAY DEVICE

CROSS-REFERENCE TO RELATED DISCLOSURES

The present application is a continuation of U.S. patent application Ser. No. 18/189,316, filed on Mar. 24, 2023, which claims priority to Chinese Patent Application No. 202211504902.X, filed on Nov. 28, 2022, the content of all of the above-mentioned patent applications is incorporated herein by reference in their entirety.

TECHNICAL FIELD

The present disclosure relates to the field of display technologies, and in particular, to a display panel and a display device.

BACKGROUND

In the field of display technology, the stability of the light emission effect of the light-emitting element is an important index for measuring the performance of the display panel and the display device. The light-emitting of the light-emitting element depends on the driving of the pixel circuit including a thin-film transistor and other electronic component.

An active layer of the thin-film transistor is usually made of a semiconductor material having a photoelectric effect, and when the active layer of a thin-film transistor is continuously irradiated by light, its threshold will drift, and its lifetime will be reduced. Therefore, it is beneficial to consider how to reduce an influence of light on the thin-film transistor in the pixel circuit to ensure the stability of light emission of the light-emitting element.

SUMMARY

A first aspect of the present disclosure provides a display panel. In an embodiment, the display panel includes: a substrate; pixel circuit islands provided at a side of the substrate, one of the pixel circuit islands includes at least one pixel circuit; light-emitting elements provided at a side of the pixel circuit islands away from the substrate and respectively electrically connected to the pixel circuits of the pixel circuit islands; and light-blocking structures including at least one of a reflective structure or a light-absorbing structure. In an embodiment, the light-blocking structures include first light-blocking structures, each of which is provided on at least one sidewall of one pixel circuit island of the pixel circuit islands.

A second aspect of the present disclosure provides a display device, including a display panel. In an embodiment, the display panel includes: a substrate; pixel circuit islands provided at a side of the substrate, each of the pixel circuit islands includes at least one pixel circuit; light-emitting elements provided at a side of the pixel circuit islands away from the substrate and respectively electrically connected to the pixel circuits of the pixel circuit islands; and light-blocking structures including at least one of a reflective structure or a light-absorbing structure. In an embodiment, the light-blocking structures include first light-blocking structures, each of which is provided on at least one sidewall of one pixel circuit island of the pixel circuit islands.

BRIEF DESCRIPTION OF THE DRAWINGS

To describe the technical solutions in the embodiments of the present disclosure more clearly, the following briefly describes the accompanying drawings required for describing the embodiments of the present disclosure. The accompanying drawings in the following description show some embodiments of the present disclosure, and a person skilled in the art can still derive other drawings from these accompanying drawings.

DETAILED DESCRIPTION

In order to better illustrate technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in some embodiments of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate A alone, both A and B, and B alone. In addition, the symbol "/" in the context generally indicates that the relation between the objects in front and at the back of "/" is an "or" relationship.

In the description of this specification, it is to be understood that the terms "substantially", "approximately", "about", "approximately", as described in the claims and embodiments of this disclosure "about," "approximately," "generally," "substantially," and the like are terms that can be generally agreed upon within a reasonable range of process operation or tolerance, and are not an exact value.

It should be understood that, while the terms first, second, third, etc. can be used in embodiments of the present disclosure to describe light-blocking structures, etc., the structures, such as light-blocking structures, should not be limited to these terms. These terms are used only to distinguish the structures, such as light-blocking structures, from each other. For example, without departing from the scope of embodiments of the present disclosure, a first light-blocking structure can also be referred to as a second light-blocking structure, and similarly, a second light-blocking structure can also be referred to as a first light-blocking structure.

Figure 1:
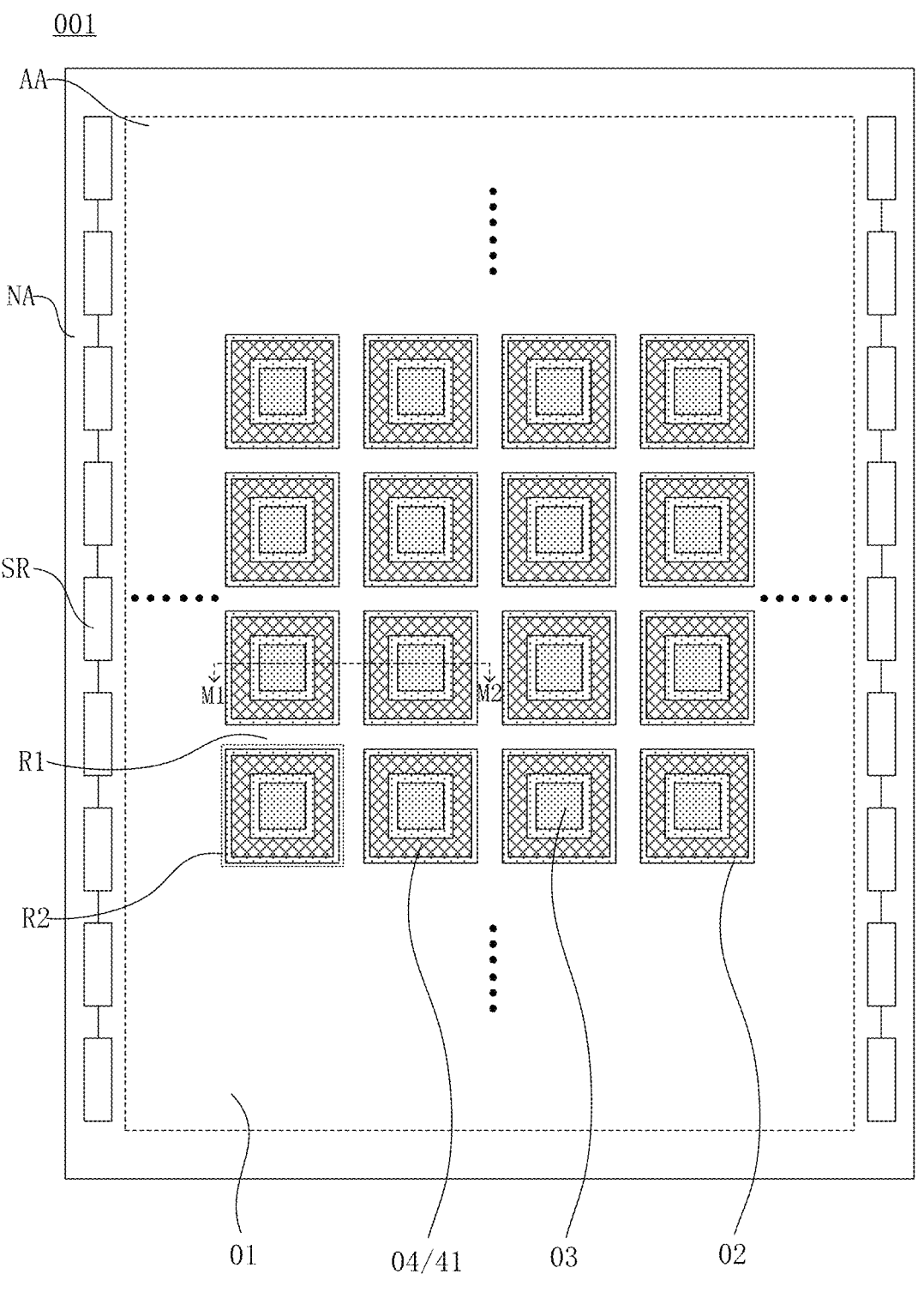
FIG. 1 is a schematic diagram of a display panel provided by some embodiments of the present disclosure.
Figure 2:
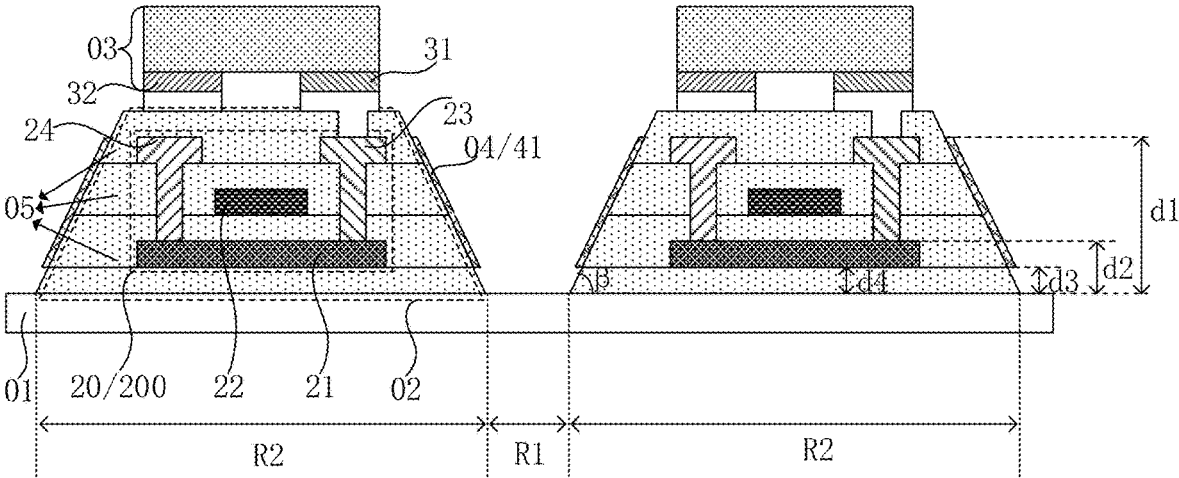
FIG. 2 is a cross-section view along M1-M2 shown in FIG. 1 according to an embodiment of the present disclosure.

FIG. 1 is a schematic diagram of a display panel provided by some embodiments of the present disclosure, and FIG. 2 is a cross-section along M1-M2 shown in FIG. 1.

Combining FIG. 1 and FIG. 2, a display panel 001 provided by an embodiment of the present disclosure includes a substrate 01, pixel circuit islands 02 and light-emitting elements 03. The pixel circuit islands 02 and the light-emitting elements 03 are provided on a same side of the substrate 01, and the light-emitting element 03 is provided on a side of the pixel circuit island 02 away from the substrate 01.

The pixel circuit island 02 includes at least one pixel circuit 20. As shown in FIG. 2, the pixel circuit 20 includes a transistor 200, and the transistor 200 usually includes a semiconductor layer 21, a gate 22, a source 23, and a drain 24. Although only one transistor 200 being included in the pixel circuit 20 is illustrated in FIG. 2, the pixel circuit 20 may include multiple transistors 200.

It can be understood that the accompanying drawings of the present disclosure use simple schematic diagrams to clearly describe the embodiments of the present disclosure. For example, FIG. 2 illustrates that the light-emitting element 03 is electrically connected to the source 23 of one of the transistors 200 in the pixel circuit 20. However, in an embodiment, the light-emitting element 03 may be electrically connected to the source 23 of one of the transistors 200 in the pixel circuit 20 in other ways, rather than the connection manner shown in FIG. 2. For example, an adapter electrode electrically connecting the light-emitting element 03 and the source 23 may be provided therebetween.

It can be understood that the pixel circuits 20 included in different pixel circuit islands 02 can be connected to each other, and the pixel circuit 20 of the pixel circuit island 02 can be connected to structures at the outside of the pixel circuit island 02, such as a signal line or an element.

At least a portion of an insulating layer 05 is broken between adjacent pixel circuit islands 02. That is, the insulating layer 05 between at least two layers of the pixel circuits 20 is broken in a region between the pixel circuit islands 02 to form the pixel circuit islands 02, and then the pixel circuit islands 02 are protruding structures provided on a side of the substrate 01.

In some embodiments, as shown in FIG. 2, a portion of the insulating layer 05 located between the substrate 01 and a layer of the source 23 of the pixel circuit 20 and a portion of the insulating layer 05 located between the substrate 01 and a layer of the drain 24 of the pixel circuit 20 are broken in the region between the pixel circuit islands 02.

The light-emitting element 03 can be provided on the pixel circuit island 02 and electrically connected to the pixel circuit 20, and the pixel circuit 20 can provide a light-emitting driving current or a light-emitting driving voltage to drive the light-emitting element 03 to emit light.

In the embodiments of the present disclosure, the display panel 001 further includes a light-blocking structure 04, and the light-blocking structure 04 includes a reflective structure and/or a light-absorbing structure. The light-blocking structure 04 can prevent light incident on it from further propagating. For example, the light-blocking structure 04 can include a reflective structure. For another example, the light-blocking structure 04 can include a light-absorbing structure. For another example, the light-blocking structure 04 can include both a reflective structure and a light-absorbing structure.

The reflective structure is a structure having a surface on which light is incident and then is significantly reflected, and the light-absorbing structure is a structure having a surface on which light is incident and then is mostly absorbed and relatively is not reflected.

When the light-blocking structure 04 includes both the reflective structure and the light-absorbing structure, a part of the light-blocking structure 04 is the reflective structure and another part of the light-blocking structure 04 is the light-absorbing structure. In some embodiments, when the light-blocking structure 04 includes both the reflective structure and the light-absorbing structure, the reflective structure and the light-absorbing structure are stacked on one another at a certain position of the light-blocking structure 04.

The light-blocking structures 04 include a first light-blocking structure 41 provided on a sidewall of the pixel circuit island 02. The first light-blocking structure 41 can prevent light out of the pixel circuit island 02 from entering the pixel circuit island 02 through the sidewall of the pixel circuit island 02, thereby reducing the light out of the pixel circuit island 02 that enters the semiconductor layer 21 of the transistor 200 of the pixel circuit island 02, so that the stable performance of the pixel circuit 20 of the pixel circuit island 02 can be achieved.

As can be seen from FIG. 2, light incident to one pixel circuit island 02 is mainly light emitted by the light-emitting element 03 above another pixel circuit island 02 adjacent to the one pixel circuit island 02, and is mainly incident to the one pixel circuit island 02 from the sidewall of the one pixel circuit island 02 when the light is incident to the semiconductor layer 21 of the transistor 200 of the one pixel circuit island 02. Therefore, when the first light-blocking structure 41 is provided on the sidewall of the pixel circuit island 02, it prevents or limits the light emitted by the light-emitting element 03 above another pixel circuit island 02 adjacent to the one pixel circuit island 02 from affecting the performance of the pixel circuit 20 at the inside of the one pixel circuit island 02.

In some embodiments of the present disclosure, the light-emitting element 03 can be a micro-light-emitting diode (Micro-LED), Mini-LED, or an organic light-emitting diode (OLED). It should be noted that, the light-emitting element 03 can also be other types of light-emitting element, which is not limited in the present disclosure.

In some embodiments of the present disclosure, an angle β formed between the sidewall of the pixel circuit island 02 and a plane of the substrate 01 is greater than or equal to 30° and smaller than or equal to 45°, that is, as shown in FIG. 2, $45° \geq \beta \geq 30°$. Thus, an angle formed between the first light-blocking structure 41 and the plane of the substrate 01 is also greater than or equal to 30° and smaller than or equal to 45°. Thus light that might otherwise irradiate on the semiconductor layer 21 is blocked.

In some embodiments of the present disclosure, in combination with FIG. 1 and FIG. 2, one pixel circuit island 02 can include one pixel circuit 20.

Figure 3:
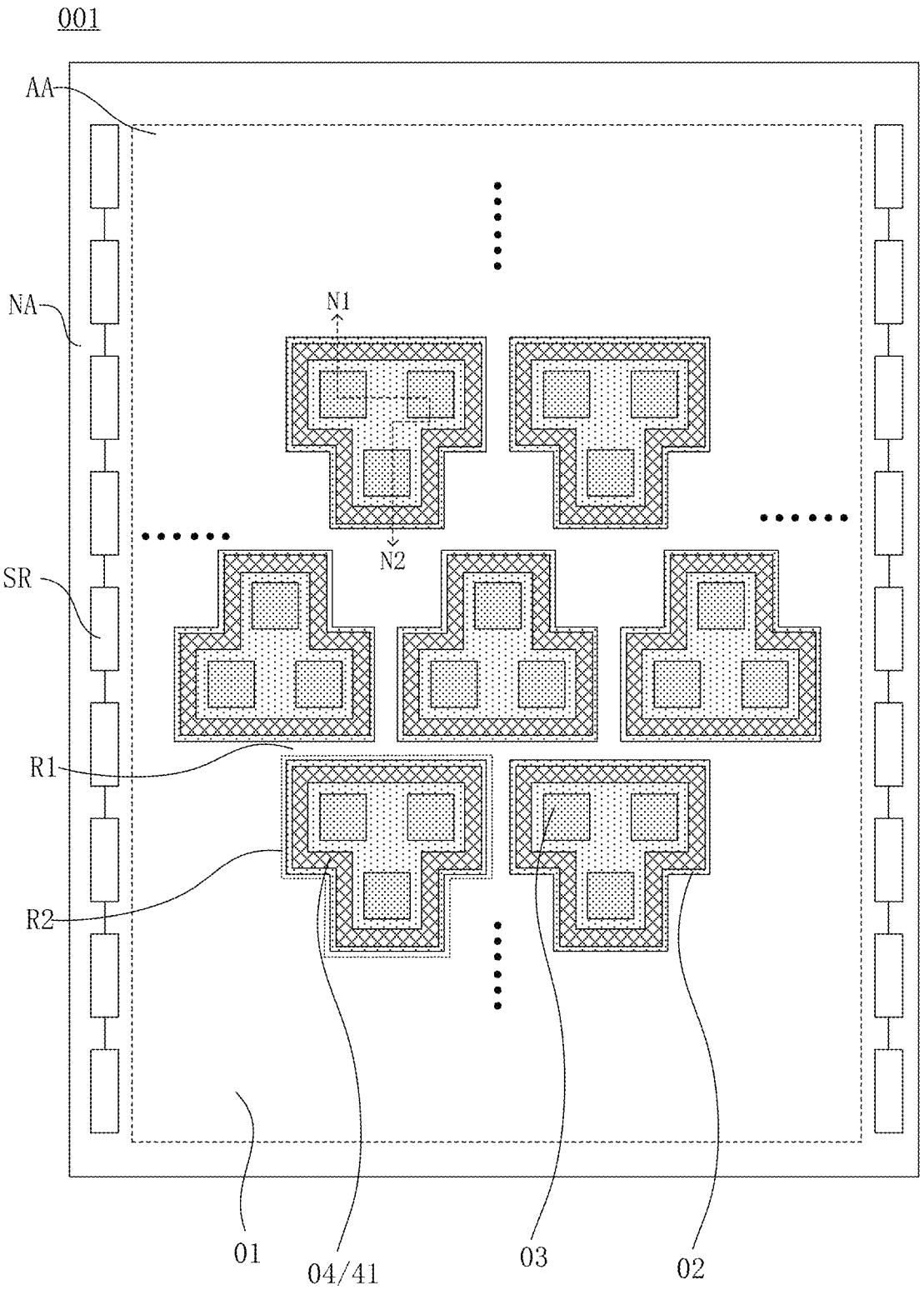
FIG. 3 is a schematic diagram of a display panel provided by some embodiments of the present disclosure.
Figure 4:
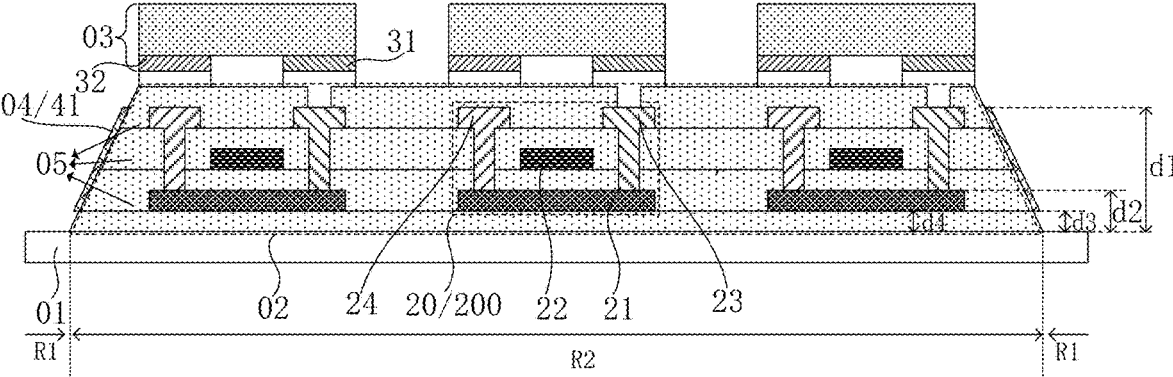
FIG. 4 is a cross-section view along N1-N2 shown in FIG. 3 according to an embodiment of the present disclosure.

FIG. 3 is a schematic diagram of a display panel provided by some embodiments of the present disclosure, and FIG. 4 is cross-section view along N1-N2 shown in FIG. 3.

In some embodiments of the present disclosure, in combination with FIG. 3 and FIG. 4, one pixel circuit island 02 can include multiple pixel circuits 20. For example, in combination with FIG. 3 and FIG. 4, when three sub-pixels form a pixel, the pixel circuits 20 of the three sub-pixels can be arranged in a same pixel circuit island 02.

FIG. 2 and FIG. 3 respectively illustrate a case where the pixel circuit island 02 includes the pixel circuit 20 of one sub-pixel and a case where the pixel circuit island 02 includes the pixel circuits 20 of three sub-pixels. It should be noted that, the pixel circuit island 02 can include the pixel circuits 20 of other number of the sub-pixels, which is not limited herein.

In some embodiments of the present disclosure, in combination with FIG. 1 and FIG. 2, as well as FIG. 3 and FIG. 4, a region between adjacent pixel circuit islands 02 includes a first region R1, and light transmittance of the first region R1 is greater than light transmittance of a region R2 where the pixel circuit island 02 is located. By dividing the pixel circuits 20 in the display panel 001 into pixel circuit islands 02 wrapped by the insulating layer 05, a segment difference of the insulating layer 05 between the pixel circuit islands 02 is formed by thinning or hollowing out the insulating layer 05 between the pixel circuit islands 02, so that the light transmittance of the display panel 001 can be increased, then the display panel 001 provided by the embodiments of the present disclosure can have a higher light transmission rate.

Figure 5:
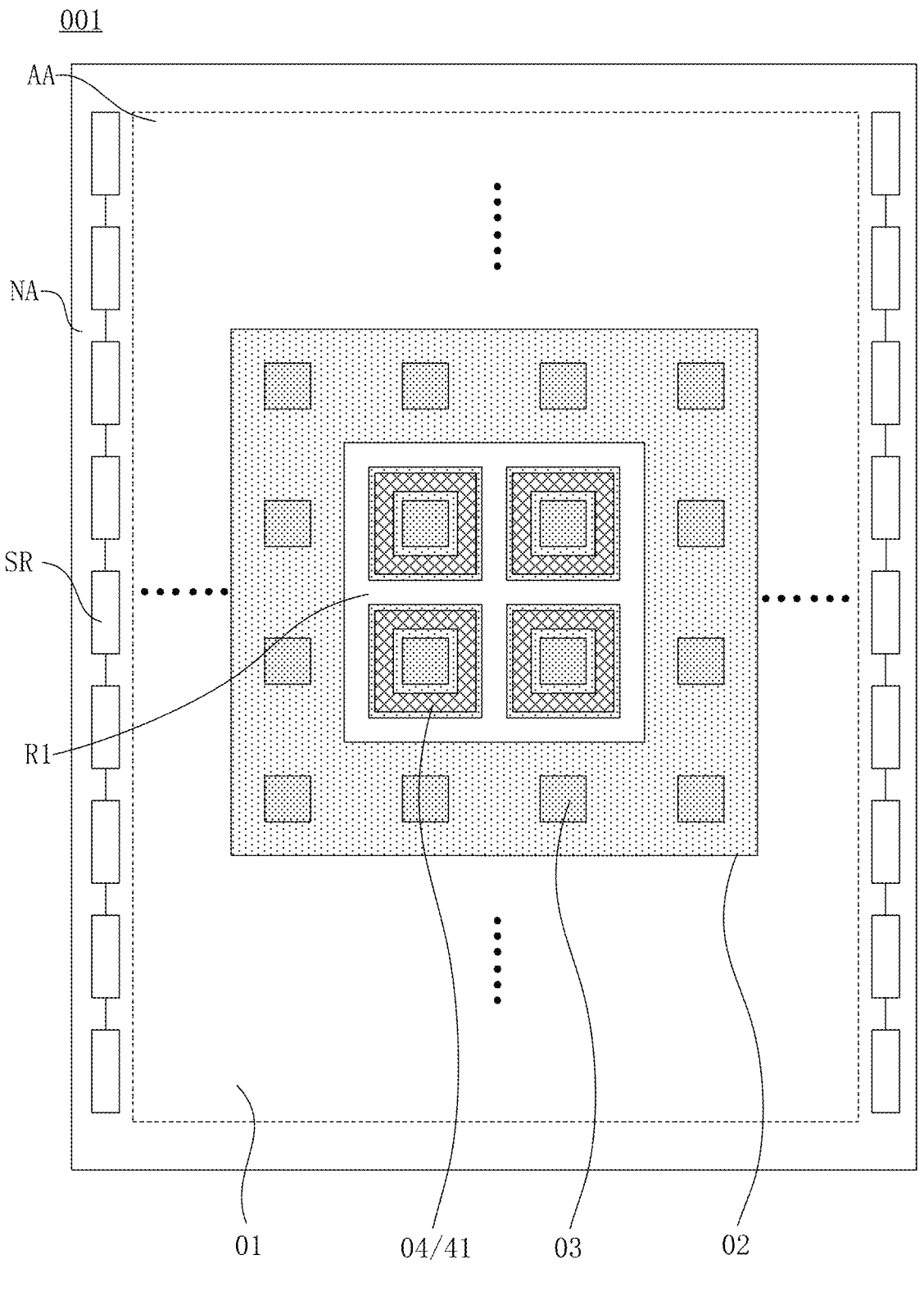
FIG. 5 is a schematic diagram of a display panel provided by some embodiments of the present disclosure.

FIG. 5 is a schematic diagram of a display panel provided by some embodiments of the present disclosure.

As shown in FIG. 1, all the pixel circuits 20 in the display panel 001 can be wrapped by the insulating layer 05 to form the pixel circuit islands 02, then the first regions R1 are uniformly distributed in the whole display region of the display panel 001, and the whole display region of the display panel 001 can have a high light transmission rate.

In some embodiments, as shown in FIG. 5, at least some pixel circuits 20 in the display panel 001 can be wrapped by the insulating layer 05 to form the pixel circuit islands 02, and another at least some pixel circuits 20 have a conventional design. That is, the first regions R1 are distributed in only a part of the display region of the display panel 001, and then a part of the display region of the display panel 001 can have a high light transmission rate, for example, the pixel circuit island 02 can be provided in a region of the display panel 001 corresponding to an external photosensitive element, and the first region R1 is provided in the region of the display panel 001 corresponding to the external photosensitive element.

As shown in FIG. 1, FIG. 3, and FIG. 5, when the pixel circuit island 02 is provided near an edge of the display region AA of display panel 001, a segment difference is also formed between the insulating layer between these pixel circuit island 02 and a non-display region NA of display panel 001, so that the light-blocking structure 04 can also be provided on a sidewall of the circuit island, in the non-display region NA of display panel 001, facing towards the display region AA.

For example, cascaded shift register circuits SR are provided in the non-display region NA, and the shift register circuits SR are provided in shift register circuit islands, and the light-blocking structure 04 can also be provided on a sidewall of the shift register circuit island facing towards the display region AA.

In some embodiments of the present disclosure, as shown in FIG. 2 and FIG. 4, in a direction perpendicular to a plane of the display panel 001, the first light-blocking structure 41 includes a first edge L1 and a second edge L2 that are opposite to each other, and the first edge L1 is away from the substrate 01 and the second edge L2 is close to the substrate 01. That is, in a thickness direction of the display panel 001, the first edge L1 of the first light-blocking structure 41 can be an upper edge away from the substrate 01, and the second edge L2 of the first light-blocking structure 41 can be a lower edge close to the substrate 01.

A distance d1 between the first edge L1 and the substrate 01 is greater than or equal to a distance d2 between substrate 01 and a surface of the semiconductor layer 21 close to the light-emitting element 03. That is, the upper edge of the first light-blocking structure 41 is higher than or aligned with an upper surface of the semiconductor layer 21. In this way, the semiconductor layer 21 does not protrude from the upper edge of the first light-blocking structure 41.

In some embodiments, in order to achieve that the upper edge of the first light-blocking structure 41 on the sidewall of the pixel circuit island 02 is aligned with or protrudes from the upper surface of the semiconductor layer 21, the insulating layer 05 above the semiconductor layer 21 of the pixel circuit island 02 can be not continued to the region between adjacent pixel circuit islands 02. That is, the insulating layer 05 above the semiconductor layer 21 of the pixel circuit island 02 is hollowed out at the region between adjacent pixel circuit islands 02.

A distance d3 between the second edge L2 and the substrate 01 is smaller than or equal to a distance d4 between the substrate 01 and a surface of the semiconductor layer 21 away from the light-emitting element 03. That is, a lower edge of the first light-blocking structure 41 is lower than or aligned with a lower surface of the semiconductor layer 21. In this way, the semiconductor layer 21 does not protrude from the lower edge of the first light-blocking structure 41.

In some embodiment, in order to achieve that the lower edge of the first light-blocking structure 41 on the sidewall of the pixel circuit island 02 is aligned with or protrudes from the lower surface of the semiconductor layer 21, the insulating layer 05 above the substrate 01 of the pixel circuit island 02 can be not continued to the region between adjacent pixel circuit islands 02. That is, the insulating layer

05 above the substrate 01 of the pixel circuit island 02 is hollowed out at the region between adjacent pixel circuit islands 02.

In some embodiments, the distance d1 between the first edge L1 and the substrate 01 is greater than or equal to the distance d2 between the substrate 01 and the surface of the semiconductor layer 21 close to the light-emitting element 03, and the distance d3 between the second edge L2 and the substrate 01 is smaller than or equal to the distance d4 between the substrate 01 and the surface of the semiconductor layer 21 away from the light-emitting element 03. Then, in a direction parallel to the plane of the panel 001, the first light-blocking structure 41 can cover the semiconductor layer 21. That is, the semiconductor layer 21 is provided in the region surrounded by the first light-blocking structure 41 and the semiconductor layer 21 does not protrude from the upper edge and the lower edge of the first light-blocking structure 41. Then, the first light-blocking structure 41 can effectively protect the semiconductor layer 21 from being affected by light propagating from the sidewall of the pixel circuit island 02.

Figure 6:
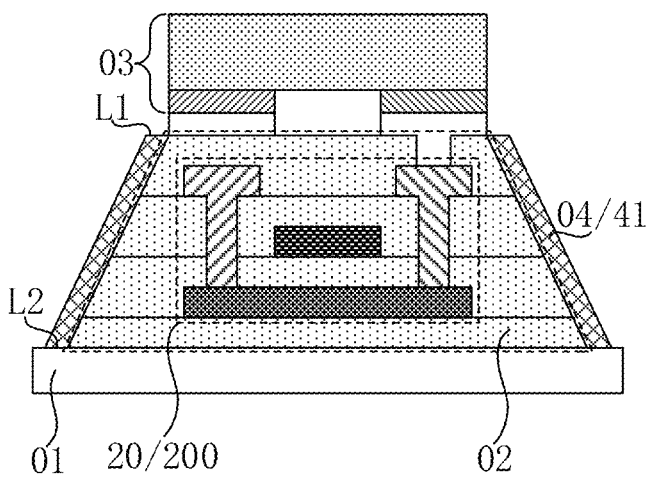
FIG. 6 is a cross-section view of a pixel circuit island in a display panel provided by some embodiments of the present disclosure.

FIG. 6 is a cross-section view of a pixel circuit island in a display panel provided by some embodiments of the present disclosure.

In some embodiments, as shown in FIG. 6, the first edge L1 of the first light-blocking structure 41 is substantially aligned with the upper edge of the sidewall of the pixel circuit island 02, and the second edge L2 of the first light-blocking structure 41 is aligned with the lower surface of the sidewall of the pixel circuit island 02.

When the insulating layer 05 in contact with the substrate 01 breaks between adjacent pixel circuit islands 02, the second edge L2 of the first light-blocking structure 41 can be in contact with the substrate 01.

Figure 7:
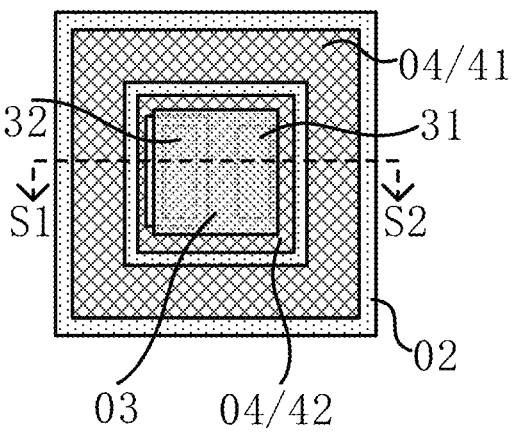
FIG. 7 is a plan view of a pixel circuit island and a light-emitting element provided by some embodiments of the present disclosure.
Figure 8:
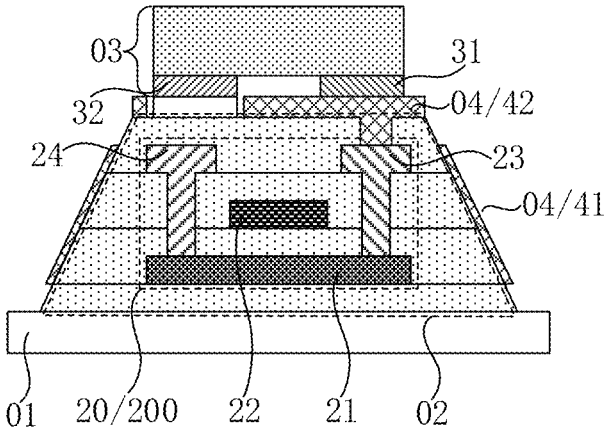
FIG. 8 is a cross-section view along S1-S2 shown in FIG. 7 according to an embodiment of the present disclosure.

FIG. 7 is a plan view of a pixel circuit island and a light-emitting element provided by some embodiments of the present disclosure, and FIG. 8 is a cross-section view along S1-S2 shown in FIG. 7.

In some embodiments of the present disclosure, in combination with FIG. 7 and FIG. 8, the light-blocking structures 04 include a second light-blocking structure 42. In a direction perpendicular to the plane of the display panel 001, the second light-blocking structure 42 is provided between the semiconductor layer 21 and the light-emitting element 03. That is, the second light-blocking structure 42 and the first light-blocking structure 41 are light-blocking structures 04 provided at different positions of the pixel circuit island 02.

In some embodiments, an orthographic projection of the second light-blocking structure 42 onto the substrate 01 at least a partially overlaps an orthographic projection of the semiconductor layer 21 of the pixel circuit island 02 onto the substrate 01. For example, the orthographic projection of the second light-blocking structure 42 onto the substrate 01 at least a partially overlaps an orthographic projection of a channel region of the semiconductor layer 21 of the pixel circuit island 02 onto the substrate 01. For example, the second light-blocking structure 42 can completely cover the channel region of the semiconductor layer 21 of the pixel circuit island 02 along the direction perpendicular to the plane of the display panel 001.

In this way, the second light-blocking structure 42 can prevent the light emitted by the light-emitting element 03 above the pixel circuit island 02 from being incident downward to the channel region of the semiconductor layer 21 of the pixel circuit 20, thereby avoiding or limiting the light emitted by the light-emitting element 03 above the pixel circuit island 02 affecting the performance of the pixel circuit 20 of the pixel circuit island 02.

Figure 9:
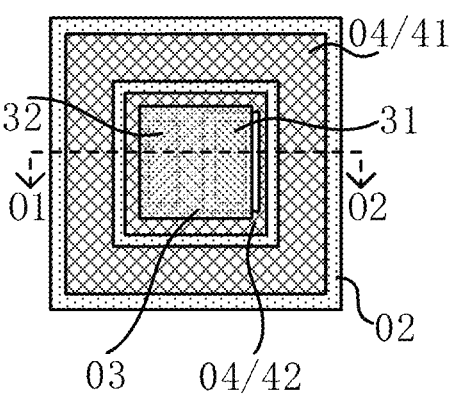
FIG. 9 is a plan view of a pixel circuit island and a light-emitting element provided by some embodiments of the present disclosure.

In some embodiments, in combination with FIG. 8 and FIG. 9, at least a part of the second light-blocking structure 42 electrically connects the light-emitting element 03 with the pixel circuit 20. That is, the second light-blocking structure 42 can be a conductive structure, and at least a part of the second light-blocking structure 42 is provided between the light-emitting element 03 and the pixel circuit 20 and can serve as a connecting electrode that connects the light-emitting element 03 with the pixel circuit 20. For example, at least a part of the second light-blocking structure 42 is electrically connected to the anode 31 of the light-emitting element 03 and is configured to connect the anode 31 of the light-emitting element 03 with the pixel circuit 20. In this way, the second light-blocking structure 42 not only prevents or limits the light emitted by the light-emitting element 03 from affecting the performance of the pixel circuit 20 of the pixel circuit island 02, but also ensures the yield of the electrical connection between the light-emitting element 03 and the pixel circuit 20.

In some embodiments, in combination with FIG. 8 and FIG. 9, the whole second light-blocking structure 42 is used to electrically connect the light-emitting element 03 with the pixel circuit 20. When the pixel circuit island 02 includes multiple pixel circuits 20, the multiple pixel circuits 20 are electrically connected to corresponding light-emitting elements 03 through different second light-blocking structures 42.

Figure 10:
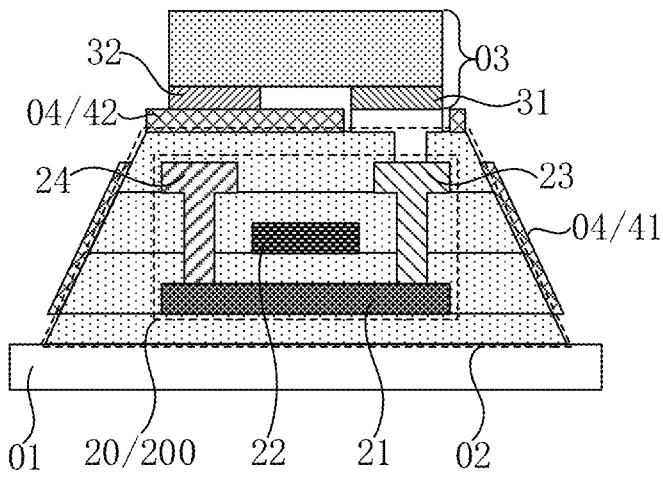
FIG. 10 is a cross-section view along O1-O2 shown in FIG. 9.

FIG. 9 is a plan view of a pixel circuit island and a light-emitting element provided by some embodiments of the present disclosure, and FIG. 10 is a cross-section view along O1-O2 shown in FIG. 9.

In some embodiments, in combination with FIG. 9 and FIG. 10, at least a part of the second light-blocking structure 42 is configured to transmit a cathode signal to the light-emitting element 03. That is, the second light-blocking structure 42 is connected to the cathode 32 of the light-emitting element 03. In this way, the second light-blocking structure 42 can not only prevent the light emitted by the light-emitting element 03 from affecting the performance of the pixel circuit 20 of the pixel circuit island 02, but also be reused as a structure configured to provide the cathode signal to the light-emitting element 03, resulting in a simple and cost-saving process.

In some embodiments, in combination with FIG. 9 and FIG. 10, the whole second light-blocking structure 42 is electrically connected to only the cathode 32 of the light-emitting element 03. When one pixel circuit island 02 includes multiple pixel circuits 20, the cathodes 32 of all light-emitting elements 03 of the light-emitting elements 03 that are electrically connected to the multiple pixel circuits 20 are electrically connected to a same second light-blocking structure 42.

Figure 11:
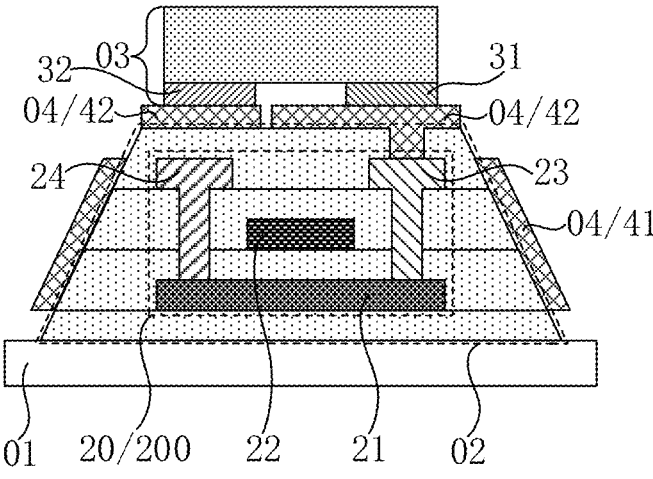
FIG. 11 is a cross-section view of a pixel circuit island and a light-emitting element in a display panel provided by some embodiments of the present disclosure; according to an embodiment of the present disclosure

FIG. 11 is a cross-section view of a pixel circuit island and a light-emitting element in a display panel provided by some embodiments of the present disclosure.

In some embodiments, as shown in FIG. 11, a part of the second light-blocking structure 42 is electrically connected to the cathode 32 of the light-emitting element 03 and is configured to transmit the cathode signal to the light-emitting element 03, and another part of the second light-blocking structure 42 is electrically connected to the anode 31 of the light-emitting element 03 and is configured to connect the light-emitting element 03 with the pixel circuit 20.

Figure 12:
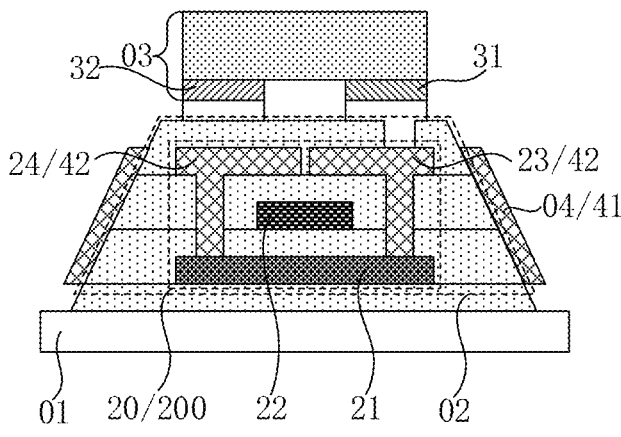
FIG. 12 is a cross-section view of a pixel circuit island and a light-emitting element in a display panel provided by some embodiments of the present disclosure.
Figure 13:
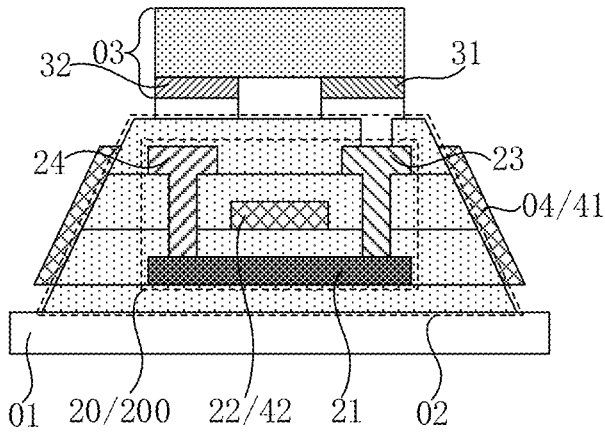
FIG. 13 is a cross-section view of a pixel circuit island and a light-emitting element in a display panel provided by some embodiments of the present disclosure.

FIG. 12 is a cross-section view of a pixel circuit island and a light-emitting element in a display panel provided by some embodiments of the present disclosure, and FIG. 13 is a cross-section view of a pixel circuit island and a light-emitting element in a display panel provided by some embodiments of the present disclosure.

In some embodiments, as shown in FIG. 12 and FIG. 13, at least a part of the second light-blocking structure 42 is reused as at least one of the source 23, the drain 24, or the gate 22 of the transistor 200.

For example, as shown in FIG. 12, a part of the second light-blocking structure 42 is reused as the source 23 of the transistor 200, and another part of the second light-blocking structure 42 is reused as the drain 24 of the transistor 200.

For example, as shown in FIG. 13, the second light-blocking structure 42 is reused as the gate of the transistor 200.

In some embodiments, at least a part of the first light-blocking structure 41 and at least a part of the second light-blocking structure 42 that are located at a same pixel circuit island 02 are connected to each other, and then the first light-blocking structure 41 and the second light-blocking structure 42 that are connected to each other can effectively prevent the light propagating above and the side of the pixel circuit island 02 from affecting the performance of the pixel circuit 20 of the pixel circuit island 02.

In some embodiments, the configuration of the first light-blocking structure 41 on the sidewall of the pixel circuit island 02 can be determined according to a manner in which the second light-blocking structure 42 provided at the pixel circuit island 02 is connected to the light-emitting element 03 and the pixel circuit 20.

Figure 14:
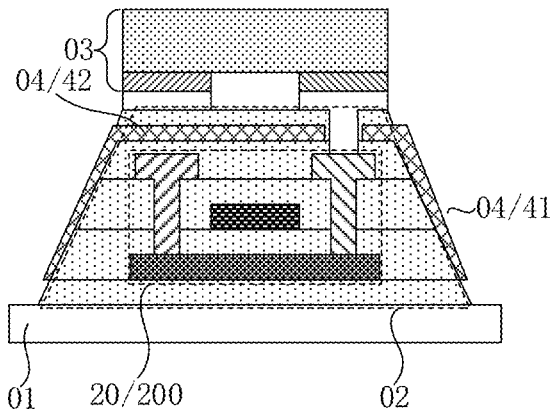
FIG. 14 is a cross-section view of a pixel circuit island and a light-emitting element in a display panel provided by some embodiments of the present disclosure.
Figure 15:
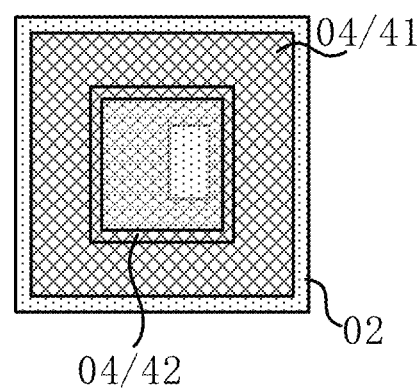
FIG. 15 is a plan view of the pixel circuit island shown in FIG. 14 according to an embodiment of the present disclosure.
Figure 16:
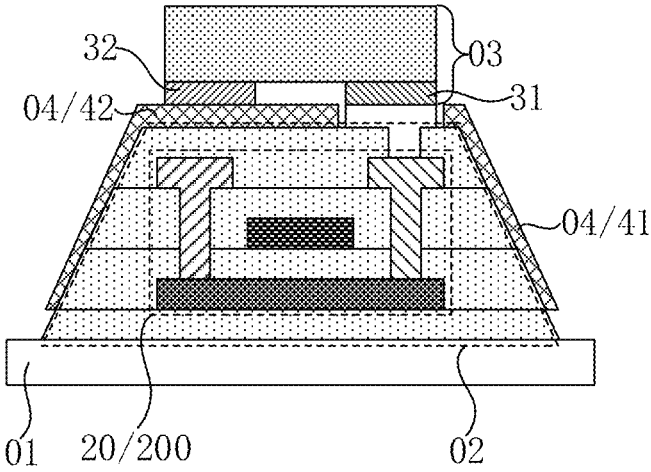
FIG. 16 is a cross-section view of a pixel circuit island and a light-emitting element in a display panel provided by some embodiments of the present disclosure.
Figure 17:
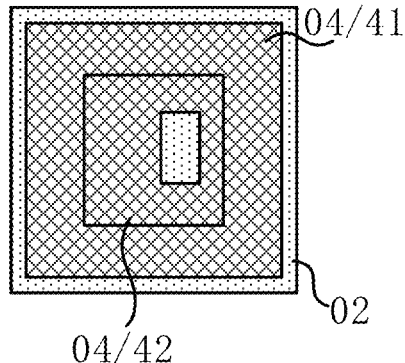
FIG. 17 is a plan view of the pixel circuit island shown in FIG. 16 according to an embodiment of the present disclosure.

FIG. 14 is a cross-section view of a pixel circuit island and a light-emitting element in a display panel provided by some embodiments of the present disclosure, FIG. 15 is a plane view of the pixel circuit island shown in FIG. 14, FIG. 16 is a cross-section view of a pixel circuit island and a light-emitting element in a display panel provided by some embodiments of the present disclosure, and FIG. 17 is a plane view of the pixel circuit island shown in FIG. 16.

In some embodiments, in combination with FIG. 14 and FIG. 15, when the second light-blocking structure 42 provided at the pixel circuit island 02 is electrically insulated from the light-emitting element 03 and also electrically insulated from the pixel circuit 20, the first light-blocking structure 41 provided on the sidewall of the pixel circuit island 02 can be a continuous structure and connected to the second light-blocking structure 42.

In some embodiments, in combination with FIG. 16 and FIG. 17, the first light-blocking structure 41 provided on the sidewall of the pixel circuit island 02 can be a continuous structure and connected to the second light-blocking structure 42 when the second light-blocking structure 42 provided at the pixel circuit island 02 is connected to only one structure. For example, as shown in FIG. 16, when the second light-blocking structure 42 provided at the pixel circuit island 02 is connected to only the cathode 32, the first light-blocking structure 41 provided on the sidewall of the pixel circuit island 02 can be a continuous structure and connected to the second light-blocking structure 42.

Figure 18:
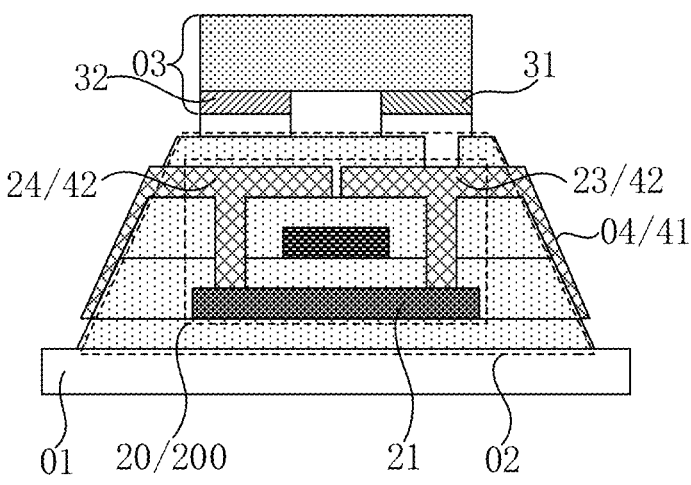
FIG. 18 is a cross-section view of a pixel circuit island and a light-emitting element in a display panel provided by some embodiments of the present disclosure.
Figure 19:
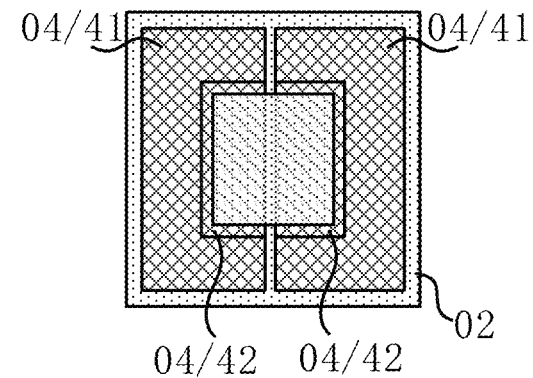
FIG. 19 is a plan view of the pixel circuit island shown in FIG. 18 according to an embodiment of the present disclosure.
Figure 20:
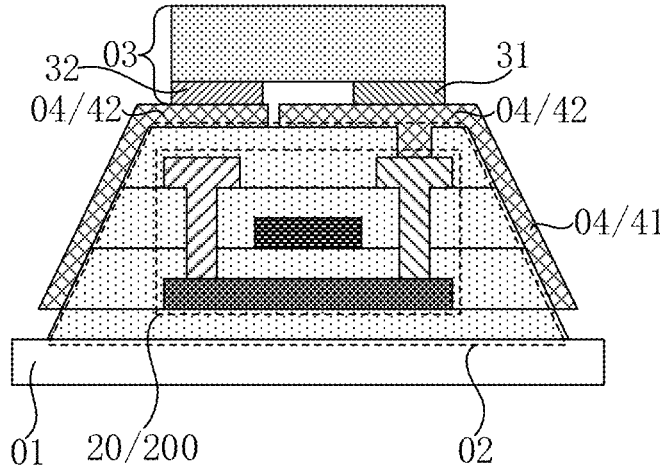
FIG. 20 is a cross-section view of a pixel circuit island and a light-emitting element in a display panel provided by some embodiments of the present disclosure.
Figure 21:
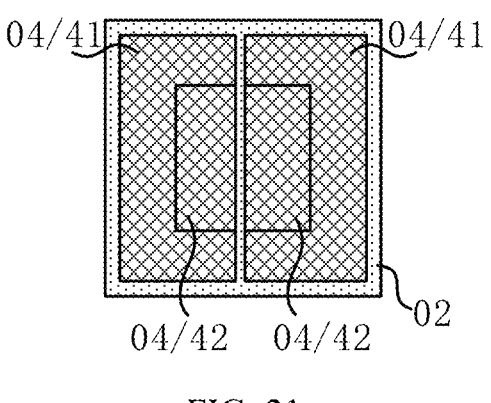
FIG. 21 is a plan view of the pixel circuit island shown in FIG. 20 according to an embodiment of the present disclosure.

FIG. 18 is a cross-section view of a pixel circuit island and a light-emitting element in a display panel provided by some embodiments of the present disclosure, and FIG. 19 is a plane view of the pixel circuit island shown in FIG. 18, and FIG. 20 is a cross-section view of a pixel circuit island and a light-emitting element in a display panel provided by some embodiments of the present disclosure, and FIG. 21 is a plane view of the pixel circuit island shown in FIG. 20.

In some embodiments, in combination with FIG. 18 and FIG. 19, as well as FIG. 20 and FIG. 21, when the second light-blocking structures 42 electrically connected to different structures are provided at a same pixel circuit island 02, these second light-blocking structures 42 electrically connected to different structures can be connected to different first light-blocking structures 41. That is, the first light-blocking structures 41 provided at the pixel circuit island 02 are discontinuous structures.

in combination with FIG. 18 and FIG. 19, when one second light-blocking structure 42 provided at the pixel circuit island 02 is reused as the source 23 of the transistor 200 and another second light-blocking structure 42 provided at the pixel circuit island 02 is reused as the drain 24 of the transistor 200, the first light-blocking structure 41 connected to the second light-blocking structure 42 reused as the source 23 of the transistor 200 and the first light-blocking structure 41 connected to the second light-blocking structure 42 reused as the drain 24 of the transistor 200 are independent from each other.

in combination with FIG. 20 and FIG. 21, when one second light-blocking structure 42 provided at the pixel circuit island 02 is electrically connected to the cathode 32 of light-emitting element 03 and another second light-blocking structure 42 provided at the pixel circuit island 02 is electrically connected to the anode 31 of light-emitting element 03, the first light-blocking structure 41 connected to the second light-blocking structure 42 electrically connected to the cathode 32 of light-emitting element 03 and the first light-blocking structure 41 connected to the second light-blocking structure 42 electrically connected to the anode 31 of light-emitting element 03 are independent from each other.

Figure 22:
FIG. 22 is another plan view of a display panel provided by some embodiments of the present disclosure.

FIG. 22 is a plan view of another display panel provided by some embodiments of the present disclosure.

In some embodiments of the present disclosure, as shown in FIG. 1, FIG. 3 and FIG. 22, the first light-blocking structures 41 respectively located on the sidewalls of adjacent pixel circuit islands 02 are independent from each other. That is, the first light-blocking structures 41 provided on the sidewalls of different pixel circuit islands 02 are disconnected from each other.

In some embodiments, as shown in FIG. 1 and FIG. 3, the first light-blocking structures 41 on the sidewalls of different pixel circuit islands 02 are disconnected from each other, and the first light-blocking structure 41 on the sidewalls of a same pixel circuit island 02 is continuous structure. That is, only one first light-blocking structure 41 is provided on the sidewalls of a same pixel circuit island 02.

In some embodiments, as shown in FIG. 22, the first light-blocking structures 41 on the sidewalls of different pixel circuit islands 02 are disconnected from each other, and at least two unconnected first light-blocking structures 41 are provided on the sidewalls of a same pixel circuit island 02. That is, at least two independent first light-blocking structures 41 are provided on the sidewalls of a same pixel circuit island 02.

Figures 23, 25:
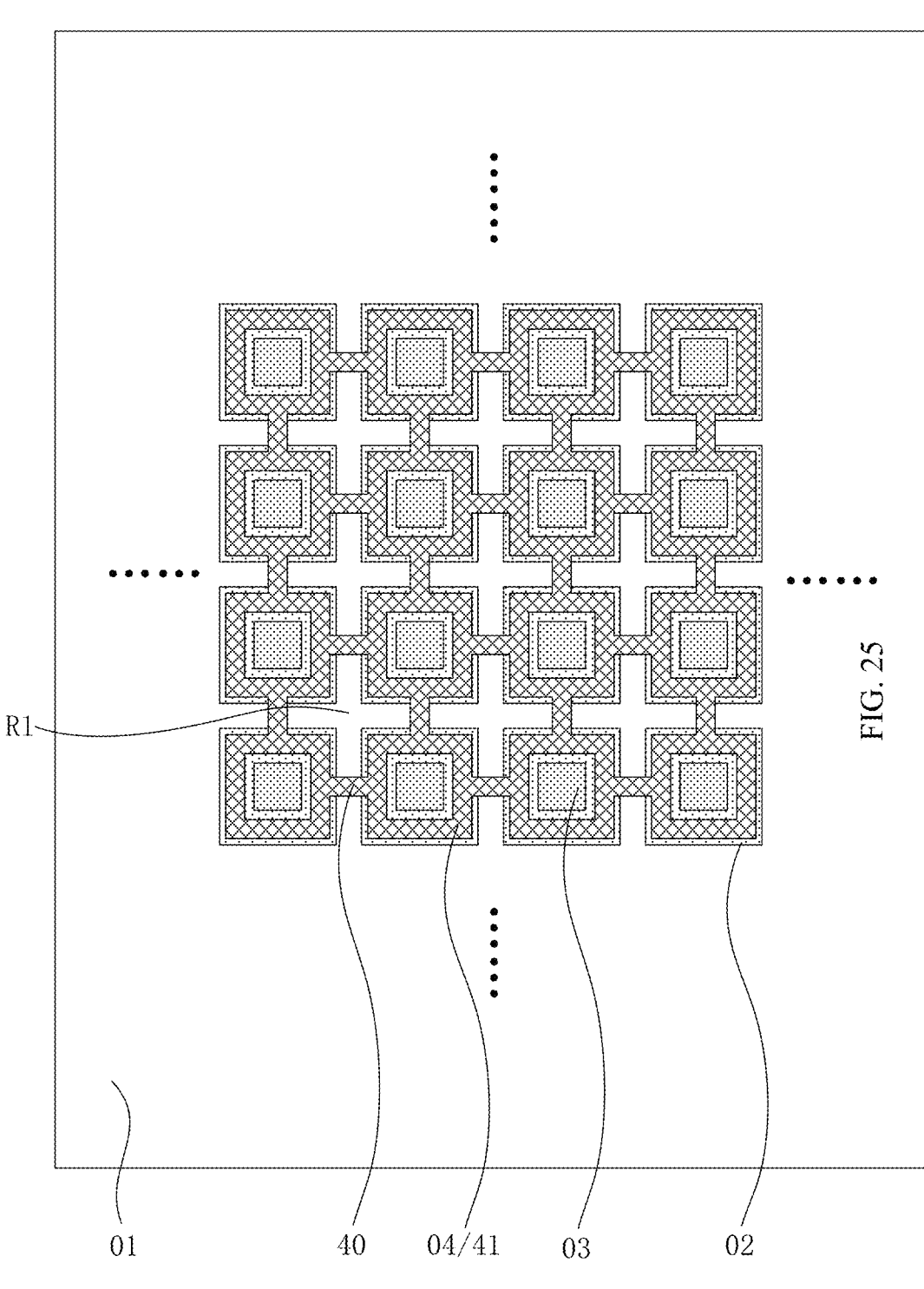
FIG. 23 is a plan view of a display panel provided by some embodiments of the present disclosure.
FIG. 25 a schematic diagram of a display panel provided by some embodiments of the present disclosure.

FIG. 23 is a plan view of a display panel provided by some embodiments of the present disclosure.

In some embodiments of the present disclosure, as shown in FIG. 23, the light-blocking structure 04 includes a connection structure 40, and the first light-blocking structures 41 provided on the sidewalls of at least two adjacent pixel circuit islands 02 are connected to each other through the connection structure 40. That is, multiple connection structures 40 are used to make the first light-blocking structures 41 on the sidewalls of the multiple pixel circuit islands 02 be connected together.

In the embodiments, as shown in FIG. 23, at least a part of the region between adjacent pixel circuit islands 02 does not overlap with the light-blocking structure 04 along the direction perpendicular to the plane of the display panel 001. When the connection structure 40 connects the first light-blocking structures 41 on the sidewalls of the adjacent pixel circuit islands 02, the connection structure 40 is provided in the region between the adjacent pixel circuit islands 02, but the connection structure 40 is not provided in all of the region between the pixel circuit islands 02. That is, the connection structure 40 is provided in at least a part of the region between at least two pixel circuit islands 02 to ensure the light transmission rate of the region between adjacent pixel circuit islands 02. For example, the connection structure 40 is not provided in the first region R1.

In some embodiments, as shown in FIG. 23, all of the first light-blocking structures 41 are connected together by the connection structure 40.

In some embodiments of the present disclosure, since the cathodes 32 of all light-emitting elements 03 in the display panel 001 can receive a same signal, when the second light-blocking structure 42 is connected to the cathode 32 of the light-emitting element 03, all second light-blocking structures 42 electrically connected to the cathodes 32 of the light-emitting elements 03 can be electrically connected together. In some embodiments, all the second light-blocking structures 42 electrically connected to the cathodes 32 of the light-emitting elements 03 are electrically connected together by the first light-blocking structures 41 and the connection structures 40.

Figure 24:
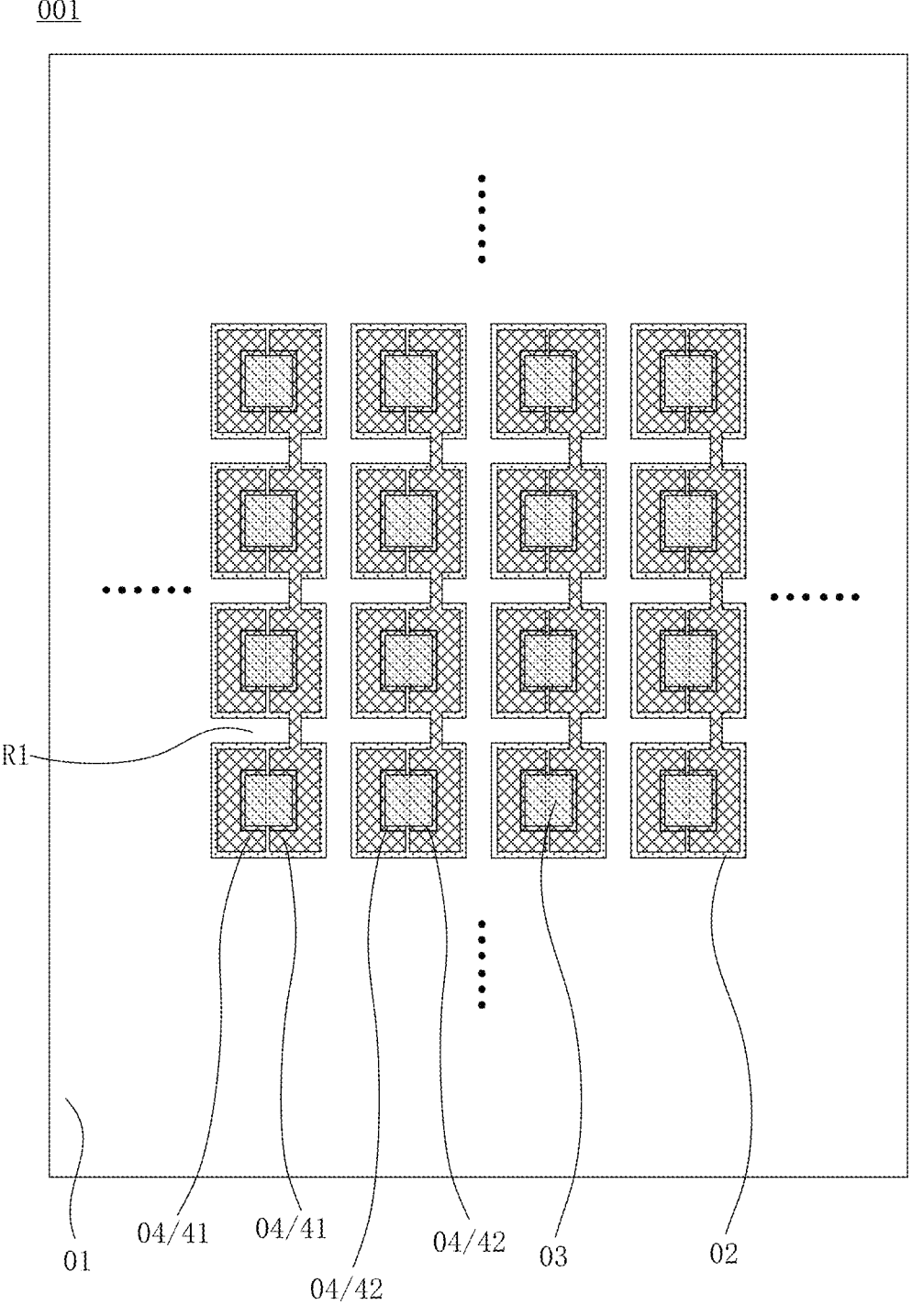
FIG. 24 a plan view of a display panel provided by some embodiments of the present disclosure.
Figure 25:
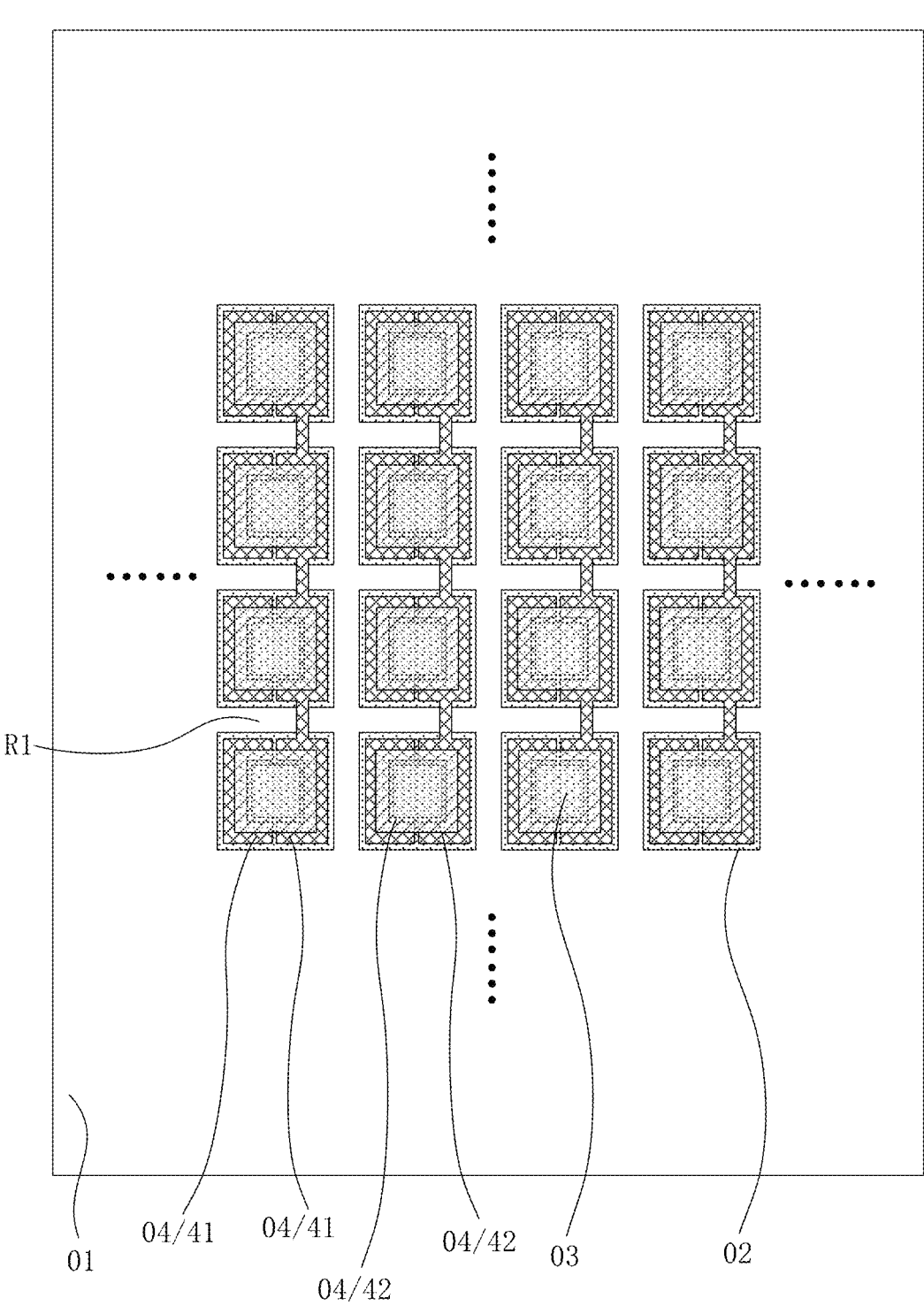

FIG. 24 is a plan view of a display panel provided by some embodiments of the present disclosure.

In some embodiments, as shown in FIG. 24, the first light-blocking structures 41 disconnected from each other are provided on the sidewalls of the pixel circuit island 02, then among adjacent pixel circuit islands 02, one first light-blocking structure 41 provided at one pixel circuit island 02 can be connected to one first light-blocking structure 41 provided at another pixel circuit island 02 through the connection structure.

In some embodiments of the present disclosure, at least one light-blocking structure 04 is electrically connected to the transistor 200 in the pixel circuit 20 and is configured to transmit a signal to the transistor 200. For example, at least a part of the second light-blocking structure 42 is reused as the source 23, then this part of the second light-blocking structure 42 is configured to provide a signal to the source 23. For example, at least a part of the second light-blocking structure 42 is reused as a gate, then this part of the second light-blocking structure 42 is configure to provide a signal to the gate 22.

FIG. 25 is a schematic diagram of a display panel provided by some embodiments of the present disclosure.

As shown in FIG. 18, when at least a part of the second light-blocking structure 42 is reused as the source 23 of the transistor 200, if this part of the second light-blocking structure 42 is electrically connected to the first light-blocking structure 41, in combination with FIG. 18 and FIG. 25, the first light-blocking structure 41 electrically connected to this part of the second light-blocking structure 42 is electrically connected to the source 23 of the transistor 200 and is configured to transmit a signal to the source 23 of the transistor 200. For example, at least two of these first light-blocking structures 41 can be electrically connected together through the connecting electrode 30 to form a first signal line, and these first light-blocking structures 41 form parts of the first signal line.

When the pixel circuit 20 includes multiple transistors 200, the second light-blocking structures 42 in the pixel circuit 20 that are reused as the sources 23 of the transistors 200 connected to different first signal lines are electrically insulated from each other, and the sources 23 of the transistors 200 connected to a same first signal line can reuse a same second light-blocking structure 42.

Figure 26:
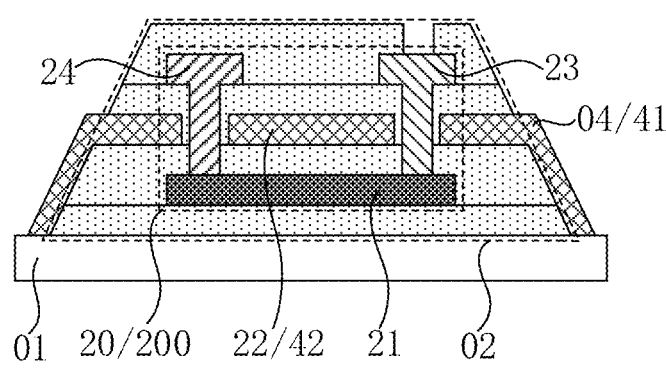
FIG. 26 is a cross-section view of a pixel circuit island in a display panel provided by some embodiments of the present disclosure.
Figure 27:
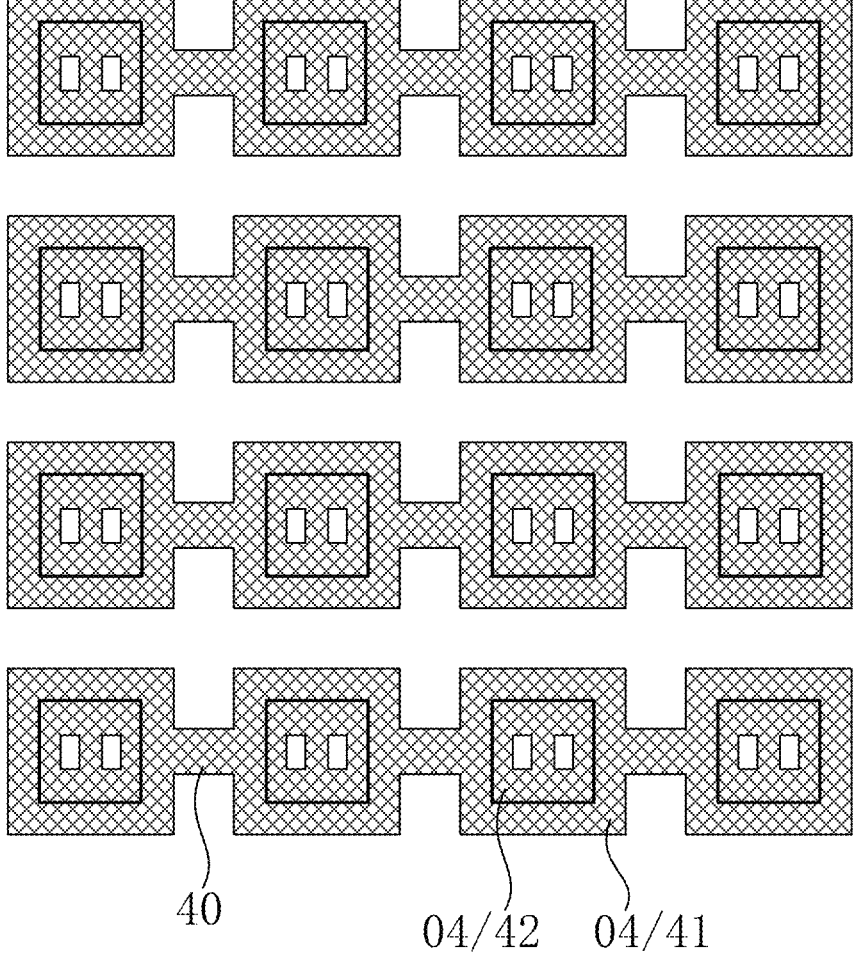
FIG. 27 is a plan view of a light-blocking structure in a display panel including the pixel circuit island shown in FIG. 26 according to an embodiment of the present disclosure.

FIG. 26 is a cross-section view of a pixel circuit island in a display panel provided by some embodiments of the present disclosure, and FIG. 27 is a plan view of a light-blocking structure in a display panel including the pixel circuit island shown in FIG. 26.

In combination with FIG. 26 and FIG. 27, when at least a part of the second light-blocking structure 42 is reused as the gate of the transistor 200, if this part of the second light-blocking structure 42 is electrically connected to the first light-blocking structure 41, the first light-blocking structure 41 electrically connected to this part of the second light-blocking structure 42 is electrically connected to the gate 22 of the transistor and is configured to transmit a scanning voltage to the gate 22 of the transistor 200. For example, at least two of these first light-blocking structures 41 are electrically connected together through the connection structure 40 to form a second signal line, then these first light-blocking structures 41 are parts of the second signal line.

When the pixel circuit 20 includes multiple transistors 200, the second light-blocking structures 42 in the pixel circuit 20 that are reused as the gates 22 of the transistors 200 electrically connected to different second signal lines are electrically insulated from each other, and the gates 22 of the transistors 200 connected to a same second signal line can reuse a same second light-blocking structure 42.

In some embodiments of the present disclosure, at least part of the light-blocking structures 04 is configured to transmit at least one of a scanning voltage, a data voltage, a power supply voltage, or a reset voltage to the transistor 200.

In some embodiments, the light-blocking structures 04 include a first-type light-blocking structure electrically connected to the transistor 200 and configured to transmit a signal to the transistor 200. As shown in FIG. 24, FIG. 25, and FIG. 27, the first-type light-blocking structure is a structure including multiple first light-blocking structures 41 and connection structures 40 each connecting adjacent first light-blocking structures 41, or the first-type light-blocking structure is a structure including first light-blocking structures 41, second light-blocking structures 42, and connection structures 40 each connecting adjacent first light-blocking structures 41. The first-type light-blocking structure can be regarded as a first signal line and/or a second signal line.

The first-type light-blocking structure includes a first part and a second part, an orthographic projection of the first part onto the substrate 01 overlaps with an orthographic projection of the pixel circuit 20 onto the substrate 01, and an orthographic projection of the second part onto the substrate 01 does not overlap with the orthographic projection of the pixel circuit 20 onto the substrate 01. A width of the first part along a direction perpendicular to an extending direction of the first-type light-blocking structure is greater than a width of the second part along the direction perpendicular to the extending direction of the first-type light blocking structure. That is, as shown in FIG. 24, FIG. 25 and FIG. 27, a width of the first light-blocking structure 41 in the first-type light-blocking structure is greater than a width of the connection structure 40, or a sum of the width of the first light-blocking structure 41 and the width of the second light-blocking structure 42 in the first-type light-blocking structure is greater than the width of the connection structure 40.

For example, as shown in FIG. 24 and FIG. 25, the first-type light-blocking structure includes first parts and second parts alternately arranged along a column direction, the first part overlaps with the pixel circuit 20, and the second part does not overlap with the pixel circuit 20. As shown in FIG. 27, the first-type light-blocking structure includes first parts and second parts alternately arranged along a row direction, the first part overlaps with the pixel circuit 20, and the second part does not overlap with the pixel circuit 20.

In the above embodiments, the first-type light-blocking structure includes the first parts and the second parts, and the first parts and the second parts of the first-type light-blocking structure are arranged in a direction substantially parallel to a length extension direction of the first-type light-blocking structure.

By setting part of the first-type light-blocking structure overlapping the pixel circuit 20 wider, external light can be blocked from being irradiated into the semiconductor layer in the transistor 200 of the pixel circuit 20.

Figure 28:
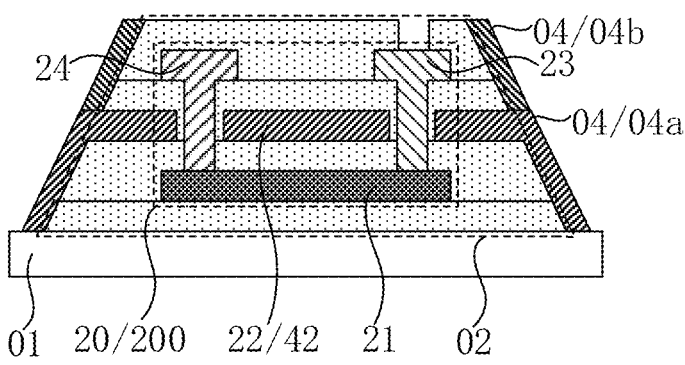
FIG. 28 is a cross-section view of a pixel circuit island in a display panel provided by some embodiments of the present disclosure.

FIG. 28 is a cross-section view of a pixel circuit island in a display panel provided by some embodiments of the present disclosure.

The light-blocking structure 04 includes a reflective structure 04a and a light-absorbing structure 04b, and the light-absorbing structure 04b is located at a side of the reflective structure 04a away from the substrate 01. In other words, at least a part of the reflective structure 04a is located at part of the sidewall of the pixel circuit island 02 close to the substrate 01, and this part of the reflective structure 04a can reflect the light emitted from the sub-pixel adjacent to the reflective structure 04a back to a light-exiting surface corresponding to the sub-pixel adjacent to the reflective structure 04a; and at least a part of the light-absorbing structure 04b is located at part of the sidewall of the pixel circuit island 02 away from the substrate 01, and this part of the light-absorbing structure 04b can avoid light crosstalk between adjacent sub-pixels.

Figure 29:
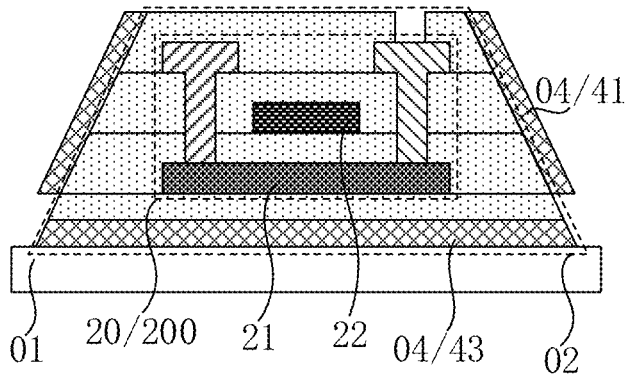
FIG. 29 is a cross-section view of a pixel circuit island in a display panel provided by some embodiments of the present disclosure.
Figure 30:
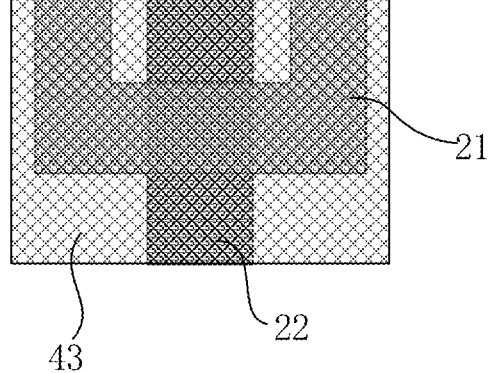
FIG. 30 is a schematic diagram of a projection of part of the structure in FIG. 29 according to an embodiment of the present disclosure.

FIG. 29 is a cross-section view of a pixel circuit island in a display panel provided by some embodiments of the present disclosure, and FIG. 30 is a schematic diagram of a projection of part of the structure in FIG. 29.

In some embodiments of the present disclosure, as shown in FIG. 29 and FIG. 30, the light-blocking structures 04 include a third light-blocking structure 43, and the third light-blocking structure 43 is provided at a side of the semiconductor layer 21 of the transistor 200 in the pixel circuit 20 of the pixel circuit island 02 away from the light-emitting element 03.

In the direction perpendicular to the plane of the display panel 001, the third light-blocking structure 43 covers the channel region (a region where the semiconductor layer 21 and the gate 22 overlap) of the semiconductor layer 21. That is, the third light-blocking structure 43 is located between the channel region of the semiconductor layer 21 and the substrate 01 and has an area larger than an area of the channel region. The third light-blocking structure 43 can prevent light incident from a side of the semiconductor layer 21 close to the substrate 01 from affecting the channel region of the semiconductor layer 21.

In some embodiments, the third light-blocking structure 43 includes a light-absorbing structure, so that the light emitted by the light-emitting element 03 can be absorbed by the third light-blocking structure 43 when propagating downward, thereby avoiding that the light is reflected and then incident to the semiconductor layer 21.

In some embodiments, the third light-blocking structure 43 includes a reflective structure in contact with the substrate 01. Since the reflective structure is usually made of metal, the reflective structure in the third light-blocking structure 43 is in contact with the substrate 01, increasing the heat dissipation efficiency of the pixel circuit island 02.

Figure 31:
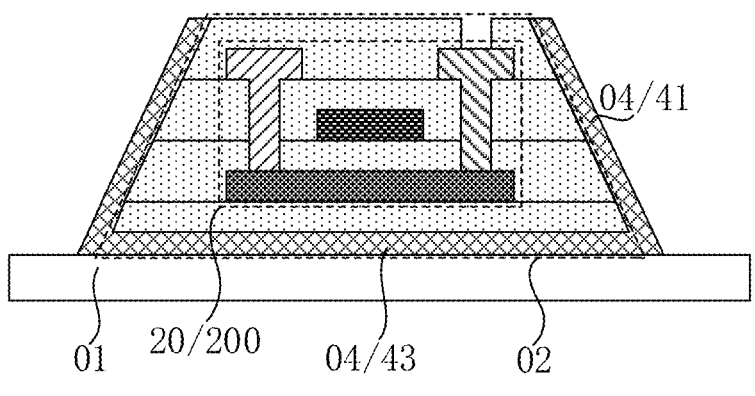
FIG. 31 is a cross-section view of a pixel circuit island in a display panel provided by some embodiments of the present disclosure.

FIG. 31 is a cross-section view of a pixel circuit island in a display panel provided by some embodiments of the present disclosure.

In some embodiments, as shown in FIG. 31, at least a part of the third light-blocking structure 43 is connected to at least a part of the first light-blocking structure 41.

In some embodiments, as shown in FIG. 31, the light-blocking structures 41 in at least one pixel circuit island 02 includes the first light-blocking structure 41 and the third light-blocking structure 43, and does not include the second light-blocking structure 41. In some embodiments, the whole first light-blocking structure 41 provided on the sidewalls of the pixel circuit island 02 can be connected to one third light-blocking structure 43.

Figure 32:
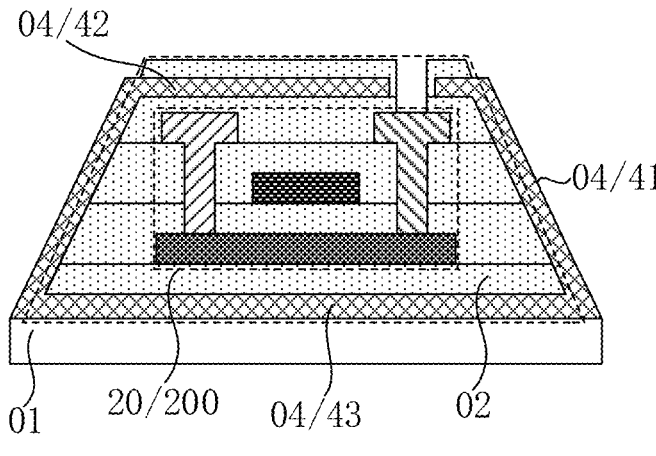
FIG. 32 is a cross-section view of a pixel circuit island in a display panel provided by some embodiments of the present disclosure.

FIG. 32 is a cross-section view of a pixel circuit island in a display panel provided by some embodiments of the present disclosure.

In some embodiments, as shown in FIG. 32, the light-blocking structures 04 provided on at least one pixel circuit island 02 can include the first light-blocking structure 41, the second light-blocking structure 42 and the third light-blocking structure 43, and configurations of the first light-blocking structure 41 and the second light-blocking structure 42 can be referred to any one of the above embodiments.

When multiple first light-blocking structures 41 that are electrically connected to different structures are provided on the sidewalls of the pixel circuit island 02, these first light-blocking structures 41 are not connected to a same third light-blocking structure 43.

In some embodiments of the present disclosure, at least one light-blocking structure 04 includes a light-absorbing structure, and at least one light-blocking structure 04 includes a reflective structure. The light-absorbing structure can include vulcanized metal, and the reflective structure can include metal. The composition of the light-blocking structure 04 can be selected depending on the location of the light-blocking structure 04 and/or the structure connected to the light-blocking structure 04.

For example, the second light-blocking structure 42 of the light-blocking structure 04 can include a reflective structure facing towards the light-emitting element 03, and the reflective structure can reflect the light emitted from the light-emitting element 03 towards the pixel circuit 20 back to the light-emitting element 03, thereby increasing the light-emitting brightness of the display panel.

For example, the third light-blocking structure 43 of the light-blocking structure 04 can include a light-absorbing structure facing towards the pixel circuit 20, and the light-absorbing structure can absorb the light emitted from the light-emitting element 03 towards the pixel circuit 20, thereby preventing the light from being incident to the semiconductor layer from the side of the pixel circuit 20 away from the light-emitting element 03.

Figure 33:
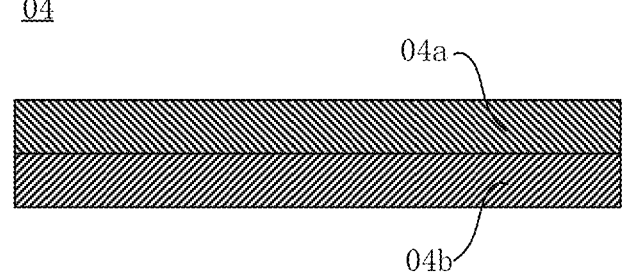
FIG. 33 is a schematic diagram of a light-blocking structure in a display panel provided by some embodiments of the present disclosure.

FIG. 33 is a schematic diagram of a light-blocking structure in a display panel provided by some embodiments of the present disclosure.

In some embodiments, as shown in FIG. 33, at least one light-blocking structure 04 includes a light-absorbing structure 04b and a reflective structure 04a that are stacked on one another.

Figure 34:
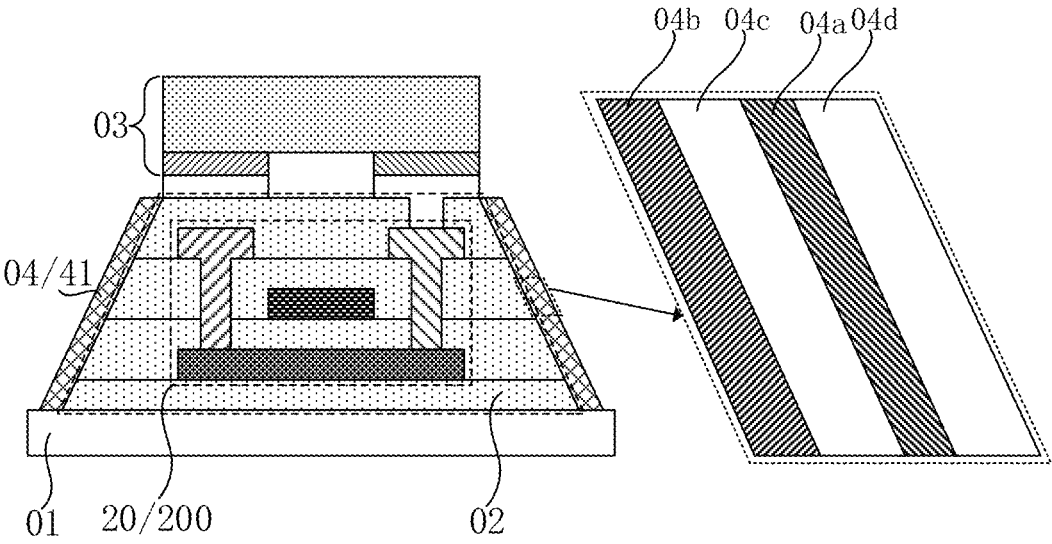
FIG. 34 is a schematic diagram of a light-blocking structure in a display panel provided by some embodiments of the present disclosure.

FIG. 34 is a schematic diagram of a light-blocking structure in a display panel provided in the present disclosure embodiment.

In some embodiments, as shown in FIG. 34, the light-absorbing structure 04b includes molybdenum sulfide, and the reflective structure 04a includes silver.

In the embodiments, when the light-absorbing structure 04b includes molybdenum sulfide and the reflective structure 04a includes silver, a barrier layer 04c may be provided between the light-absorbing structure 04b and the reflective structure 04a that are stacked on one another, and the barrier layer 04c includes molybdenum which prevents the silver from reacting with the molybdenum sulfide.

In some embodiments, a protective layer 04d is provided on a side the reflective structure 04a away from the pixel circuit island 02, and the protective layer 04d includes a metal oxide film. Since the reflective structure 04a is usually made of metal, the reflective structure 04a is easy to be oxidized or etched if exposed, so the metal oxide film is provided on a surface of the reflective structure 04a to protect the reflective structure 04a. The protective layer 04d can be a transparent metal oxide film, such as indium tin oxide (ITO), to avoid affecting the reflective effect of the reflective structure 04a.

Figure 35:
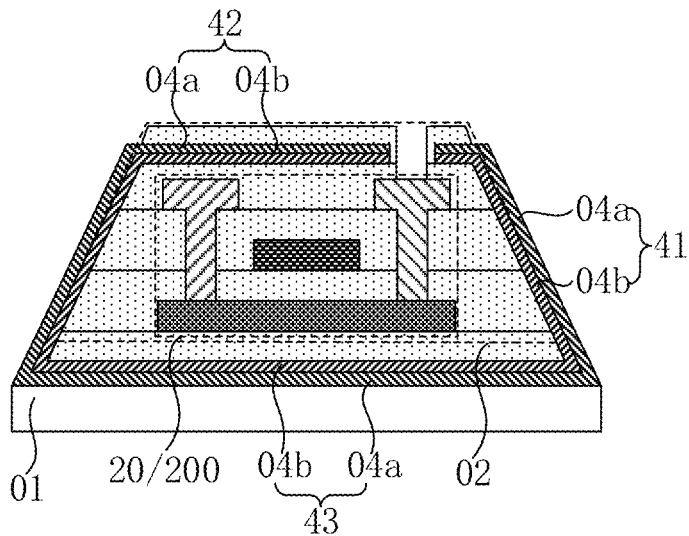
FIG. 35 is a cross-section view of a pixel circuit island in a display panel provided by some embodiments of the present disclosure.

FIG. 35 is a cross-section view of a pixel circuit island in a display panel provided by some embodiments of the present disclosure.

In some embodiments, as shown in FIG. 35, in the light-absorbing structure 04b and the reflective structure 04a that are stacked on one another in at least one light-blocking structure 04, the reflective structure 04a is provided on the side of the light-absorbing structure 04b away from the pixel circuit 20.

For example, as shown in FIG. 35, the first light-blocking structure 41, the second light-blocking structure 42, and the third light-blocking structure 43 each include a light-absorbing structure 04b and a reflective structure 04a that are stacked on one another, the reflective structure 04a of the first light-blocking structure 41 is provided on the side of the light-absorbing structure 04b of the first light-blocking structure 41 away from the pixel circuit 20, the reflective structure 04a of the second light-blocking structure 42 is provided on the side of the light-absorbing structure 04b of the second light-blocking structure 42 away from the pixel circuit 20, and the reflective structure 04a of the third light-blocking structure 43 is provided on the side of the light-absorbing structure 04b of the third light-blocking structure 43 away from the pixel circuit 20. The reflective structure 04a of the first light-blocking structure 41 and the reflective structure 04a of the second light-blocking structure 42 can reflect the light emitted from the light-emitting element 03 towards the substrate 01, and then the reflected light exits from a light-exiting surface of the display panel 001, thereby increasing the brightness of the display panel 001.

Figure 36:
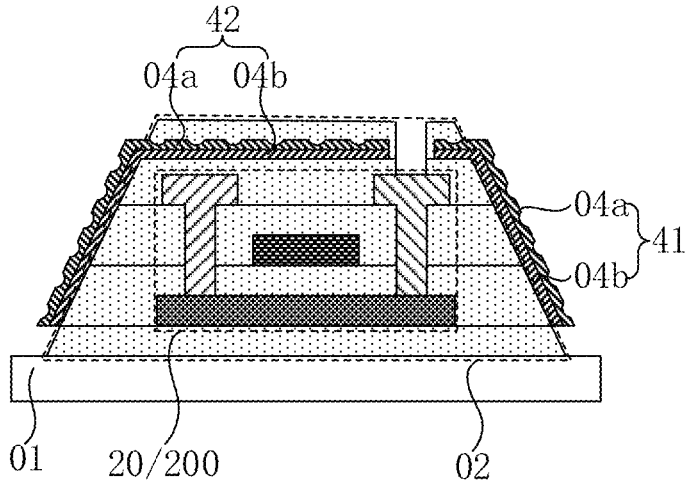
FIG. 36 is a cross-section view of a pixel circuit island in a display panel provided by some embodiments of the present disclosure.

FIG. 36 is a cross-section of a pixel circuit island in a display panel provided by some embodiments of the present disclosure.

In some embodiments of the present technical solution, in the light-absorbing structure 04b and the reflective structure 04a that are stacked on one another, a surface of the reflective structure 04a away from the pixel circuit 20 includes a concave structure. By setting the surface of the reflective structure 04*a* to include the concave structure, a convergence effect of the reflective structure 04*a* on light can be enhanced to increase the brightness of the display panel 001.

Figure 37:
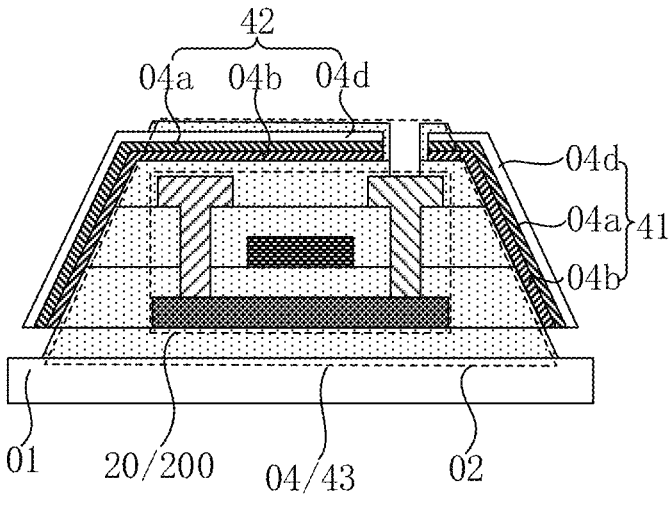
FIG. 37 is a cross-section view of a pixel circuit island in a display panel provided by some embodiments of the present disclosure.

FIG. 37 is a cross-section view of a pixel circuit island in a display panel provided by some embodiments of the present disclosure.

In some embodiments of the present technical solution, in the light-absorbing structure 04*b* and the reflective structure 04*a* that are stacked on one another, a metal oxide film is provided on the side of the reflective structure 04*a* away from the light-absorbing structure 04*b*. Since the reflective structure 04*a* is usually made of metal, when the reflective structure 04*a* is provided on the side of the light-absorbing structure 04*b* away from the pixel circuit 20, the reflective structure 04*a* is easily to be oxidized or etched if exposed, so the metal oxide film is provided on a surface of the reflective structure 04*a* to protect the reflective structure 04*a*.

Figure 38:
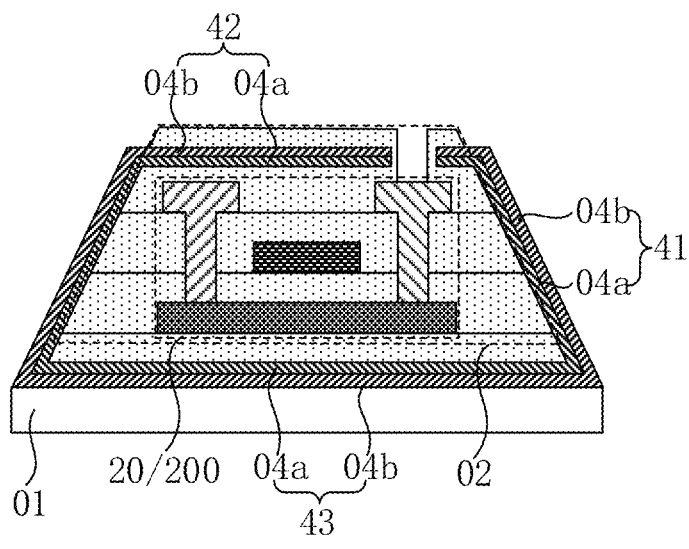
FIG. 38 is a cross-section view of a pixel circuit island in a display panel provided by some embodiments of the present disclosure.

FIG. 38 is a cross-section view of a pixel circuit island in a display panel provided by some embodiments of the present disclosure.

In some embodiments, in the light-absorbing structure 04*b* and the reflective structure 04*a* that are stacked on one another in at least one light-blocking structure 04, as shown in FIG. 38, the light-absorbing structure 04*b* is provided on the side of the reflective structure 04*a* away from the pixel circuit 20.

For example, as shown in FIG. 38, the first light-blocking structure 41, the second light-blocking structure 42, and the third light-blocking structure 43 each include a light-absorbing structure 04*b* and a reflective structure 04*a* that are stacked on one another, the light-absorbing structure 04*b* of the first light-blocking structure 41 is provided on the side of the reflective structure 04*a* of the first light-blocking structure 41 away from the pixel circuit 20, and the light-absorbing structure 04*b* of the second light-blocking structure 42 is provided on the side of the reflective structure 04*a* of the second light-blocking structure 42 away from the pixel circuit 20.

In some embodiments, the first light-blocking structure 41, the second light-blocking structure 42, and the third light-blocking structure 43 each include a light-absorbing structure 04*b* and a reflective structure 04*a* that are stacked on one another, the reflective structure 04*a* in the first light-blocking structure 41 is provided on the side of the light-absorbing structure 04*b* in the first light-blocking structure 41 close to the pixel circuit 20, the reflective structure 04*a* in the second light-blocking structure 42 is provided on the side of the light-absorbing structure 04*b* in the second light-blocking structure 42 close to the pixel circuit 20, and the reflective structure 04*a* in the third light-blocking structure 43 is provided on the side of the light-absorbing structure 04*b* in the third light-blocking structure 43 away from the pixel circuit 20.

Figure 39:
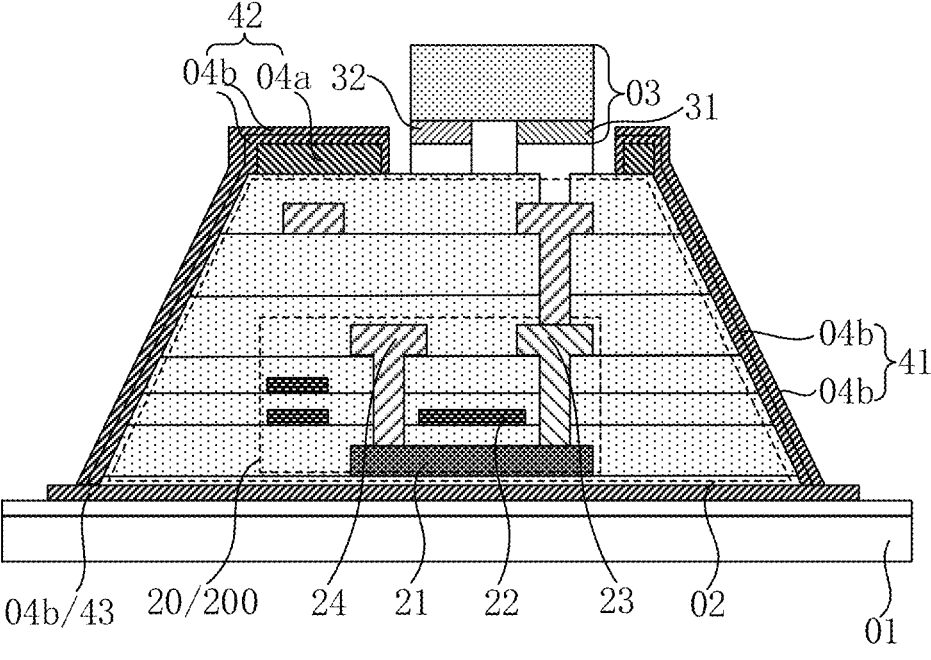
FIG. 39 is a cross-section view of a pixel circuit island in a display panel provided by some embodiments of the present disclosure.

FIG. 39 is a cross-section view of a pixel circuit island in a display panel provided by some embodiments of the present disclosure.

In some embodiments of the present disclosure, as shown in FIG. 39, the first light-blocking structure 41 includes two stacked light-absorbing structures 04*b*, one of which can be a black organic material and the other one of which can be a passivation layer, and the light-absorbing structure 04*b* formed by the passivation layer is located on the side of the light-absorbing structure formed by a black pixel defining layer away from the pixel circuit island 02.

In some embodiments of the present disclosure, as shown in FIG. 39, at least a part of the second light-blocking structure 42 includes a reflective structure 04*a* and a light-absorbing structure 04*b* that are stacked on one another, the reflective structure 04*a* can be provided in a same layer as an electrode provided on the pixel circuit island 02 and electrically connected to the anode 31 of the light-emitting element 03, and the light-absorbing structure 04*b* can be the same as and continuous with the light-absorbing structure 04*b* of the first light-blocking structure 41. The light-absorbing structure 04*b* of the second light-blocking structure 42 can be provided on the side of the reflective structure 04*a* of the second light-blocking structure 42 away from the pixel circuit island 02.

In some embodiments of the present disclosure, as shown in FIG. 39, the third light-blocking structure 43 includes a light-absorbing structure 04*b* provided on a side of the pixel circuit 20 facing towards the substrate 01. A buffer layer is provided between the third light-blocking structure 43 and the semiconductor layer 21 in the transistor 200 in the pixel circuit 20, and another buffer layer is provided between the third light-blocking structure 43 and the substrate 01.

Figure 40:
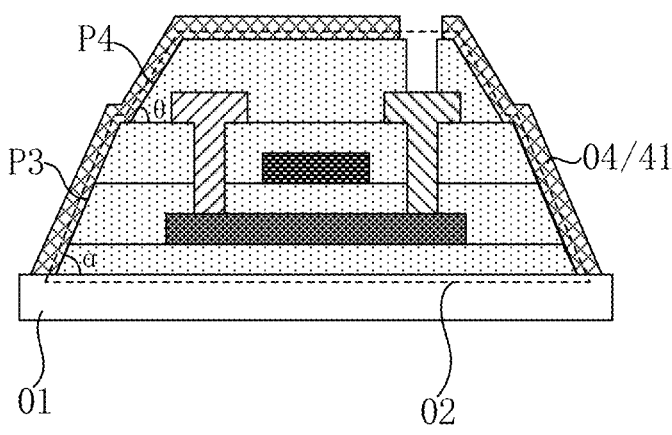
FIG. 40 is a cross-section view of a pixel circuit island in a display panel provided by some embodiments of the present disclosure.

FIG. 40 is a cross-section of a pixel circuit island in a display panel provided by some embodiments of the present disclosure.

In some embodiments of the present disclosure, as shown in FIG. 40, a sidewall of the pixel circuit island 02 includes a third part P3 and a fourth part P4, and the third part P3 is located at a side of the fourth part P4 close to the substrate 01. An angle α formed between the third part P3 and the plane of the substrate 01 is smaller than an angle θ formed between the fourth part P4 and the plane of the substrate 01, that is, α>θ.

In some embodiments, the third part P3 includes an inorganic material. That is, the third part P3 is at least a part of a sidewall of an insulating layer made of an inorganic material of the pixel circuit island 02; and the fourth part P4 includes an organic material. That is, the fourth part P4 is at least a part of a sidewall of the insulating layer made of an organic material of the pixel circuit island 02.

In some embodiments, the first light-blocking structure 41 includes a light-absorbing structure 04*b* and a reflective structure 04*a*, the third part P3 is in contact with the reflective structure 04*a*, and the fourth part P4 is in contact with the light-absorbing structure 04*b*.

In some embodiments of the present disclosure, angles formed between the substrate 01 and any different positions on the sidewall of the pixel circuit island 02 can be substantially the same, and then the sidewall of the pixel circuit island 02 corresponding to the inorganic material and the sidewall of the pixel circuit island 02 corresponding to the organic material have substantially the same tilt angle, i.e., α=θ. In the embodiments, the sidewalls of the pixel circuit island 02 are smooth, which is easy to achieve the continuous integrity of the light-blocking structure 04 provided on the sidewall of the pixel circuit island 02.

Figure 41:
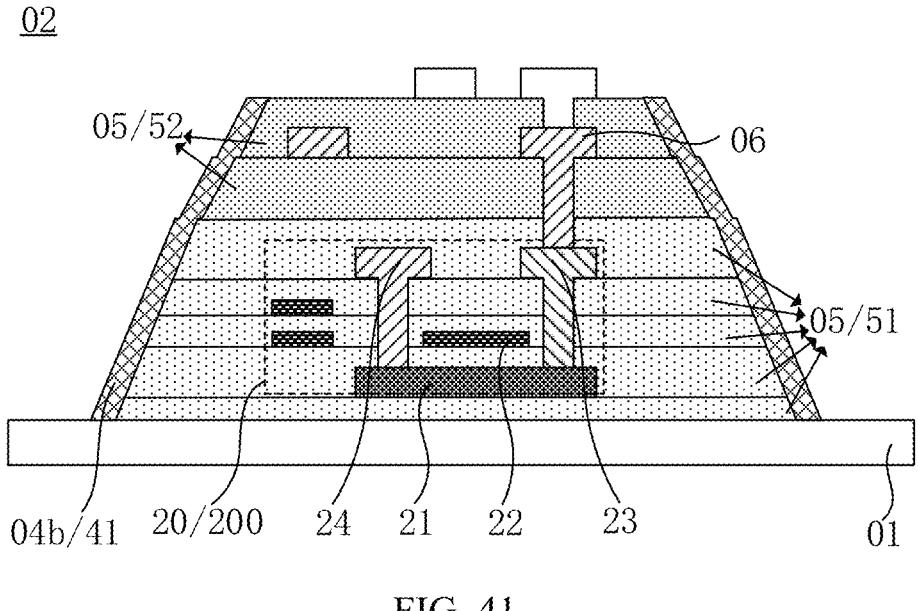
FIG. 41 is a cross-section view of a pixel circuit island in a display panel provided by some embodiments of the present disclosure.

FIG. 41 is a cross-section of a pixel circuit island in a display panel provided by some embodiments of the present disclosure.

In combination with FIG. 40 and FIG. 41, in the embodiments of the present disclosure, the insulating layer 05 of the pixel circuit island 02 includes an inorganic insulating layer 51 and an organic insulating layer 52, the inorganic insulating layer 51 is mainly provided at a position corresponding to the third part P3, and the organic insulating layer 52 is mainly provided at a position corresponding to the fourth part P4.

The inorganic insulating layer 51 includes a buffer layer, a gate insulating layer, an inter-insulating layer and a passivation layer, the buffer layer is located between the substrate 01 and a layer of the transistor 200, the gate insulating layer is located between a layer of the gate 22 and the semiconductor layer 21, the inter-insulating layer is located between a layer of the source 23 and the drain 24 and a layer of the gate 22 (the inter-insulating layer can include two layers, between which at least one electrode plate of a capacitor is provided), and the passivation layer is located on the side, away from the substrate 01, of the layer of the source 23 and the drain 24.

The organic insulating layer 52 includes a planarization layer located on a side of the layer of the pixel circuit 20 away from the substrate 01. The planarization layer can include two layers, between which an adapter electrode 06 is provided, and the adapter electrode 06 can electrically connect the light-emitting element 03 with the pixel circuit 20.

A width of the inorganic insulating layer 51 is greater than an area of the organic insulating layer 52, and a width of the organic insulating layer 52 close to the inorganic insulating layer 51 is greater than the width of the organic insulating layer 52 away from the inorganic insulating layer 51. A difference between the width of the organic insulating layer 52 close to the inorganic insulating layer 51 and a width of the inorganic insulating layer 51 is greater than a difference between the width of the organic insulating layer 52 away from the inorganic insulating layer 51 and the width of the organic insulating layer 52 close to the inorganic insulating layer 51.

It can be illustrated as that an area of an orthographic projection of the inorganic insulating layer 51 onto the substrate 01 is greater than an area of an orthographic projection of the organic insulating layer 52 onto the substrate 01, and an area of an orthographic projection of the organic insulating layer 52 close to the inorganic insulating layer 51 onto the substrate 01 is greater than an area of an orthographic projection of the organic insulating layer 52 away from the inorganic insulating layer 51 onto the substrate 01.

Figure 42:
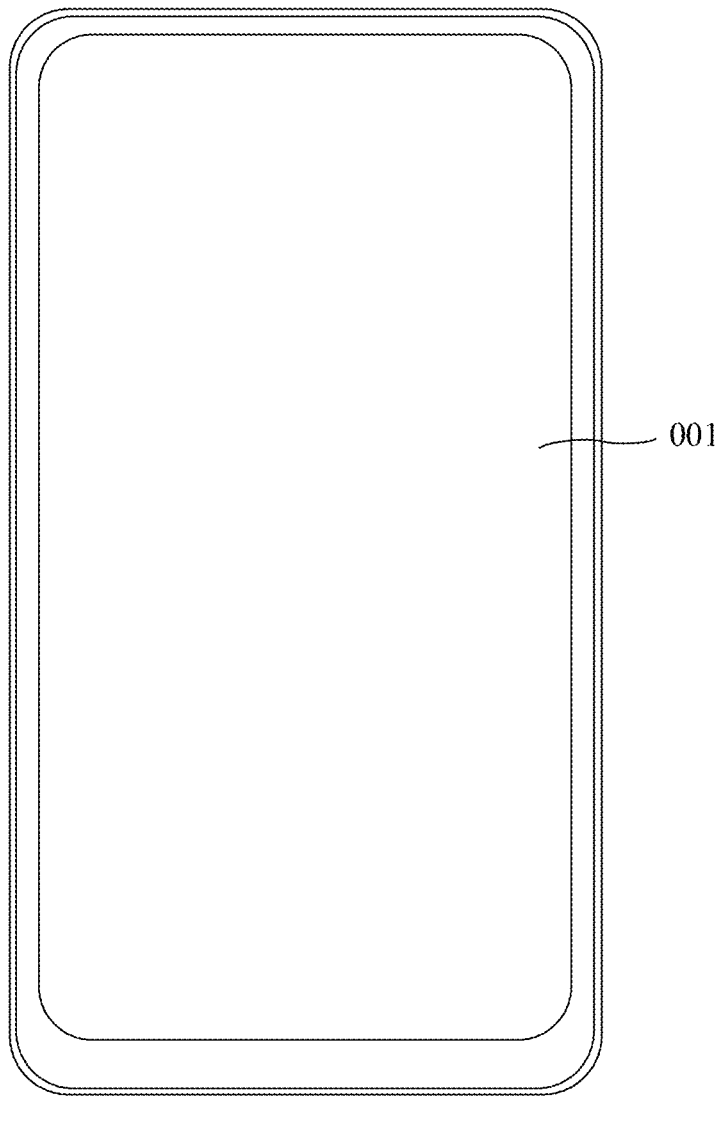
FIG. 42 is a schematic diagram of a display device provided by some embodiments of the present disclosure.

FIG. 42 is a schematic diagram of a display device provided by some embodiments of the present disclosure.

As shown in FIG. 42, some embodiments of the present disclosure also provide a display device including the display panel 001 provided by any one of the above embodiments. Exemplarily, the display device can be an electronic device such as a cell phone, a computer, a smart wearable device (e.g., a smart watch), and an on-vehicle display device, which is not limited in the present embodiments.

In the present disclosure embodiment, by providing the first light-blocking structure 41 on the sidewall of the pixel circuit island 02, the first light-blocking structure 41 can prevent light out of the pixel circuit island 02 from entering the pixel circuit island 02 through the sidewall of the pixel circuit island 02, thereby reducing the light out of the pixel circuit island 02 that enters the semiconductor layer 21 of the transistor 200 of the pixel circuit island 02, so that the stable performance of the pixel circuit 20 of the pixel circuit island 02 can be achieved.

The above description illustrates only some embodiments of the present disclosure, and is not intended to limit the present disclosure. Any modifications, equivalent replacements, improvements, and the like made within the principle of the present disclosure shall fall within the protection scope of the present disclosure.

What is claimed is:

1. A display panel, comprising,
a substrate,
a circuit and an insulating layer located on one side of the substrate;
a first region and a second region, wherein light transmittance of the first region is greater than light transmittance of the second region, and the second region is a region where the circuit is located; and wherein at least a portion of the insulating layer comprises an opening corresponding to the first region; and
a light-blocking structure comprising a first light-blocking structure, wherein the first light-blocking structure at least partially covers a sidewall of the opening,
wherein the insulating layer comprises an organic insulating layer and an inorganic insulating layer which are stacked on one another, the organic insulating layer is located on one side of the inorganic insulating layer away from the substrate, the organic insulating layer comprises a first opening, and the inorganic insulating layer comprises a second opening; and
wherein the first light-blocking structure at least partially covers a sidewall of the first opening, the first light-blocking structure at least partially covers a sidewall of the second opening, and the first light-blocking structure extends from the sidewall of the first opening to the sidewall of the second opening.

2. The display panel according to claim 1, wherein the insulating layer comprises an organic insulating layer, the organic insulating layer comprises a first opening, and the first light-blocking structure at least partially covers a sidewall of the first opening.

3. The display panel according to claim 2, wherein the organic insulating layer comprises a first organic insulating layer and a second organic insulating layer, the display panel further comprises an adapter electrode, the adapter electrode is located between the first organic insulating layer and the second organic insulating layer, and the adapter electrode is electrically connected to the circuit.

4. The display panel according to claim 3, further comprising a light-emitting element, wherein the circuit comprises a pixel circuit, and the light-emitting element is electrically connected with the pixel circuit through the adapter electrode.

5. The display panel according to claim 4, wherein the circuit further comprises a shift register circuit, the shift register circuit is located on a first side of the opening, and the pixel circuit is located on a second side of the opening, and wherein the first light-blocking structure at least partially covers the first side.

6. The display panel according to claim 1, wherein the insulating layer comprises an organic insulating layer and an inorganic insulating layer which are stacked on one another, the organic insulating layer comprises a first opening, an included angle between a sidewall of the first opening and a plane where the substrate is located is θ, the inorganic insulating layer comprises a second opening, an included angle between a sidewall of the second opening and the plane where the substrate is located is a, and wherein $\alpha \geq \theta_o$.

7. The display panel according to claim 6, wherein $45° \geq \alpha \geq \theta \geq 30°$.

8. The display panel according to claim 1, wherein the insulating layer comprises an organic insulating layer and an inorganic insulating layer which are stacked on one another, the organic insulating layer is located on one side of the inorganic insulating layer away from the substrate, the organic insulating layer comprises a first opening, and the inorganic insulating layer comprises a second opening; and wherein in the second region, an area of an orthographic projection of the inorganic insulating layer onto the substrate is greater than an area of an orthographic projection of the organic insulating layer onto the substrate.

9. The display panel according to claim 1, wherein the insulating layer comprises an organic insulating layer and an inorganic insulating layer which are stacked on one another, the organic insulating layer is located on one side of the inorganic insulating layer away from the substrate, the organic insulating layer comprises a first opening, and the inorganic insulating layer comprises a second opening; and wherein in the second region, a width of the inorganic insulating layer is greater than a width of the organic insulating layer.

10. The display panel according to claim 9, wherein the organic insulating layer comprises a first organic insulating layer and a second organic insulating layer, and the first organic insulating layer is located on one side of the second organic insulating layer close to the inorganic insulating layer; and wherein in the second region, there is a first width difference between the first organic insulating layer and the inorganic insulating layer, and there is a second width difference between the first organic insulating layer and the second inorganic insulating layer, and wherein the first width difference is greater than the second width difference.

11. The display panel according to claim 1, wherein the insulating layer comprises an organic insulating layer and an inorganic insulating layer which are stacked on one another, the organic insulating layer is located on one side of the inorganic insulating layer away from the substrate, the organic insulating layer comprises a first opening, and the inorganic insulating layer comprises a second opening; and wherein in a direction parallel to a plane of the display panel, in the first region, a width of the first opening is greater than a width of the second opening.

12. The display panel according to claim 11, wherein the organic insulating layer comprises a first organic insulating layer and a second organic insulating layer, and the first organic insulating layer is located on one side of the second organic insulating layer close to the inorganic insulating layer; and wherein in the direction parallel to the plane of the display panel, in the first region, an width of the first opening in the first organic insulating layer is greater than an width of the first opening in the second organic insulating layer.

13. The display panel according to claim 1, wherein the insulating layer comprises a first surface connected with the sidewall of the opening, and in a direction perpendicular to a plane of the display panel, the light-blocking structure at least partially covers the first surface; and wherein the light-blocking structure extends from the first surface to the sidewall of the opening.

14. The display panel according to claim 1, wherein the first light-blocking structure is in contact with the substrate.

15. The display panel according to claim 14, wherein the insulating layer comprises an inorganic insulating layer, the inorganic insulating layer comprises a second opening, and the first light-blocking structure at least partially covers a sidewall of the second opening; and wherein the first light-blocking structure extends from the sidewall of the second opening to contact the substrate.

16. The display panel according to claim 1, wherein the insulating layer comprises a plurality of the openings respectively corresponding to a plurality of the first regions, and wherein a plurality of the first light-blocking structures corresponding to the plurality of the openings are connected with each other.

17. The display panel according to claim 1, wherein the circuit comprises a semiconductor layer, the light-blocking structure comprises a third light-blocking structure, and the third light-blocking structure is located between the semiconductor layer and the substrate; and wherein the first light-blocking structure covers the third light-blocking structure in a direction parallel to a plane of the display panel.

18. The display panel according to claim 1, wherein the light-blocking structure comprises a black organic material.

19. A display device comprising a display panel comprising, a substrate, a circuit and an insulating layer located on one side of the substrate;

a first region and a second region, wherein light transmittance of the first region is greater than light transmittance of the second region, and the second region is a region where the circuit is located; and wherein at least a portion of the insulating layer comprises an opening corresponding to the first region;

a light-blocking structure comprising a first light-blocking structure which at least partially covers a sidewall of the opening, wherein the insulating layer comprises an organic insulating layer and an inorganic insulating layer which are stacked on one another, the organic insulating layer is located on one side of the inorganic insulating layer away from the substrate, the organic insulating layer comprises a first opening, and the inorganic insulating layer comprises a second opening; and wherein the first light-blocking structure at least partially covers a sidewall of the first opening, the first light-blocking structure at least partially covers a sidewall of the second opening, and the first light-blocking structure extends from the sidewall of the first opening to the sidewall of the second opening.

* * * * *